United States Patent
Date

(10) Patent No.: US 12,237,266 B2
(45) Date of Patent: Feb. 25, 2025

(54) SEMICONDUCTOR INTEGRATED CIRCUIT DEVICE

(71) Applicant: SOCIONEXT INC., Kanagawa (JP)

(72) Inventor: Koshiro Date, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 612 days.

(21) Appl. No.: 17/357,211

(22) Filed: Jun. 24, 2021

(65) Prior Publication Data

US 2021/0320065 A1    Oct. 14, 2021

Related U.S. Application Data

(63) Continuation of application No. PCT/JP2019/049190, filed on Dec. 16, 2019.

(30) Foreign Application Priority Data

Dec. 25, 2018    (JP) ................. 2018-240887

(51) Int. Cl.
| | |
|---|---|
| *H01L 23/52* | (2006.01) |
| *H01L 23/528* | (2006.01) |
| *H01L 27/092* | (2006.01) |
| *H01L 29/06* | (2006.01) |
| *H01L 29/423* | (2006.01) |

(52) U.S. Cl.
CPC ........ *H01L 23/5286* (2013.01); *H01L 27/092* (2013.01); *H01L 29/0673* (2013.01); *H01L 29/42392* (2013.01)

(58) Field of Classification Search
CPC ............... H01L 23/5286; H01L 27/092; H01L 29/0673; H01L 29/42392; H01L 29/78696; H01L 21/76895; H01L 23/5222; H01L 23/535; H01L 27/0207
See application file for complete search history.

(56) References Cited

U.S. PATENT DOCUMENTS

| | | | |
|---|---|---|---|
| 2006/0289940 A1 | 12/2006 | Hyun et al. | |
| 2007/0002617 A1* | 1/2007 | Houston | H10B 10/12 |
| | | | 257/E27.099 |

(Continued)

FOREIGN PATENT DOCUMENTS

| | | | | |
|---|---|---|---|---|
| CN | 1614766 A | * | 5/2005 | ......... G06F 17/5068 |
| JP | 2007-013156 A | | 1/2007 | |

(Continued)

OTHER PUBLICATIONS

Ryckaert J. et al., "The Complementary FET (CFET) for CMOS scaling beyond N3," 2018 Symposium on VLSI Technology Digest of Technical Papers; pp. 141-142.

(Continued)

*Primary Examiner* — Mohammed Shamsuzzaman
(74) *Attorney, Agent, or Firm* — Rimon P.C.

(57) ABSTRACT

An inverter cell having a logical function and a filler cell having no logical function are placed adjacent to each other. Nanowires of the filler cell are placed at the same positions as nanowires of the inverter cell in the Y direction. A p-type dummy transistor and n-type dummy transistor of the filler cell are respectively placed at the same levels as a p-type transistor and n-type transistor of the inverter cell in the Z direction.

9 Claims, 19 Drawing Sheets

(56) References Cited

U.S. PATENT DOCUMENTS

| | | | |
|---|---|---|---|
| 2010/0269081 A1* | 10/2010 | Hou | G06F 30/39 |
| | | | 716/130 |
| 2011/0031536 A1* | 2/2011 | Okamoto | H01L 27/11807 |
| | | | 257/E27.108 |
| 2012/0138886 A1 | 6/2012 | Kuhn et al. | |
| 2014/0217513 A1* | 8/2014 | Hayashi | H01L 27/0928 |
| | | | 257/369 |
| 2014/0239410 A1* | 8/2014 | Yang | H01L 27/11807 |
| | | | 257/390 |
| 2016/0172351 A1* | 6/2016 | Shimbo | H01L 23/528 |
| | | | 257/401 |
| 2019/0164993 A1 | 5/2019 | Shimbo | |
| 2019/0165186 A1* | 5/2019 | Shimbo | H01L 29/06 |
| 2019/0355750 A1* | 11/2019 | Do | H01L 27/0207 |
| 2019/0393206 A1* | 12/2019 | Wang | H01L 29/0696 |
| 2021/0272895 A1* | 9/2021 | Wu | H01L 27/088 |
| 2021/0272904 A1* | 9/2021 | Komuro | H01L 27/092 |
| 2021/0375863 A1* | 12/2021 | Komuro | H01L 21/823871 |
| 2022/0375920 A1* | 11/2022 | Xian | H01L 21/823871 |
| 2023/0411379 A1* | 12/2023 | Komuro | H01L 27/04 |

FOREIGN PATENT DOCUMENTS

| | | |
|---|---|---|
| JP | 2014-505995 A | 3/2014 |
| WO | 2018/025580 A1 | 2/2018 |
| WO | 2018/025597 A1 | 2/2018 |

OTHER PUBLICATIONS

A. Mocuta et al., "Enabling CMOS Scaling Towards 3nm and Beyond," 2018 Symposium on VLSI Technology Digest of Technical Papers; pp. 147-148.

Internatioal Search Report issued in International Patent Application No. PCT/JP2019/049190, dated Mar. 3, 2020; with English translation.

Written Opinion of the International Searching Authority issued in International Patent Application No. PCT/JP2019/049190, dated Mar. 3, 2020; with partial English translation.

* cited by examiner

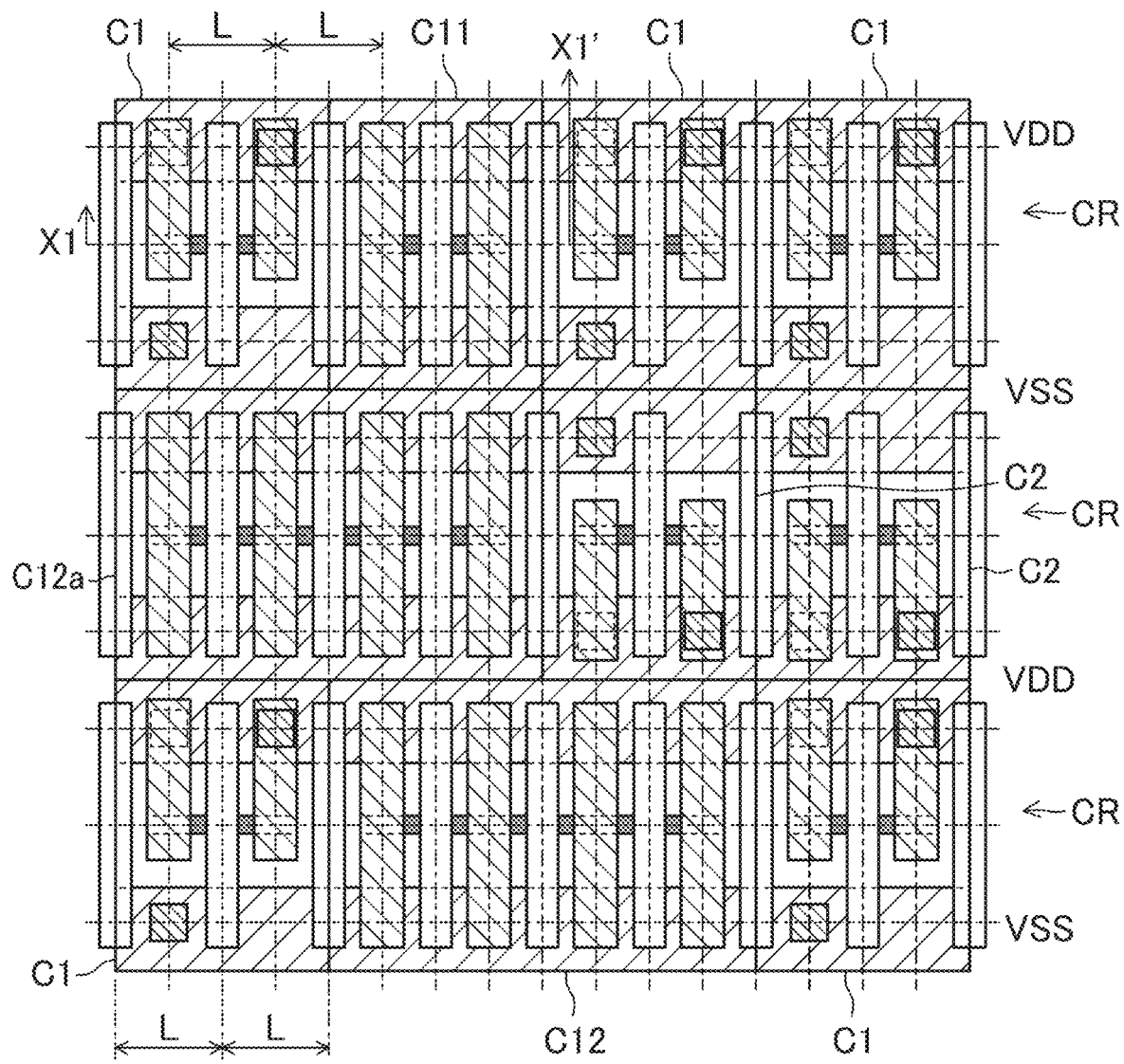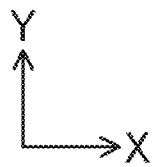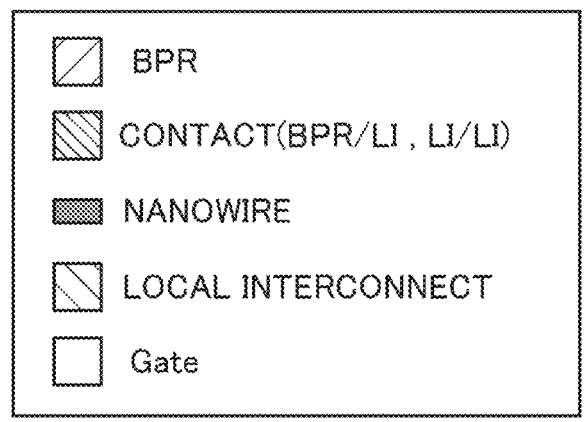

FIG.3
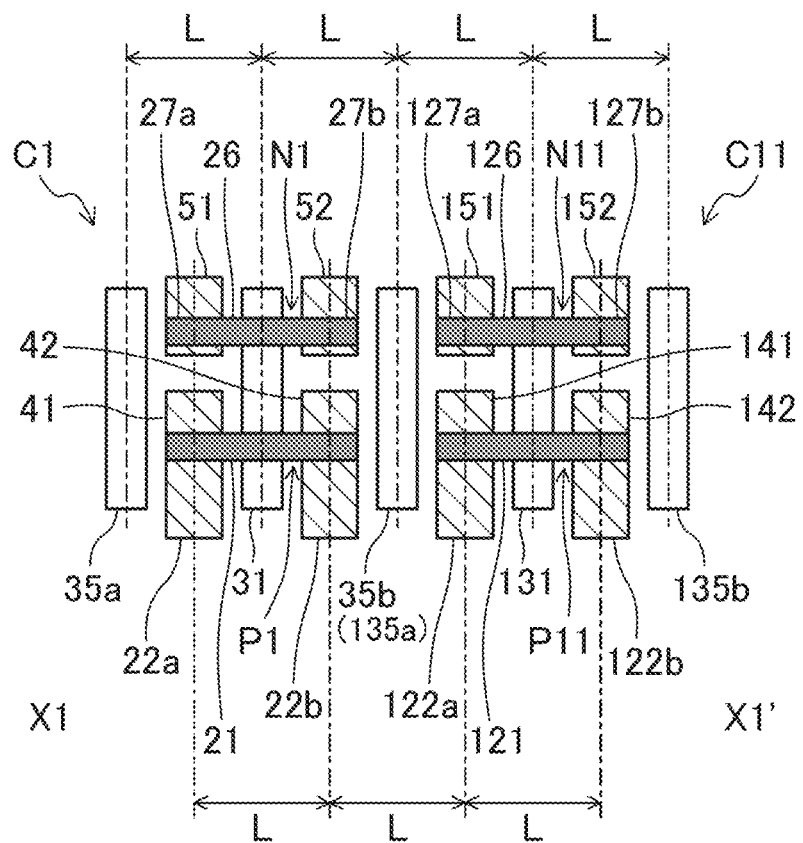
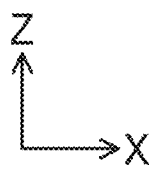
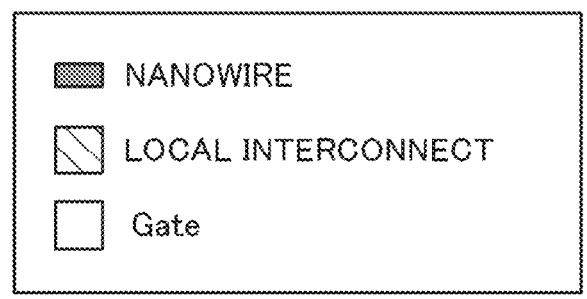

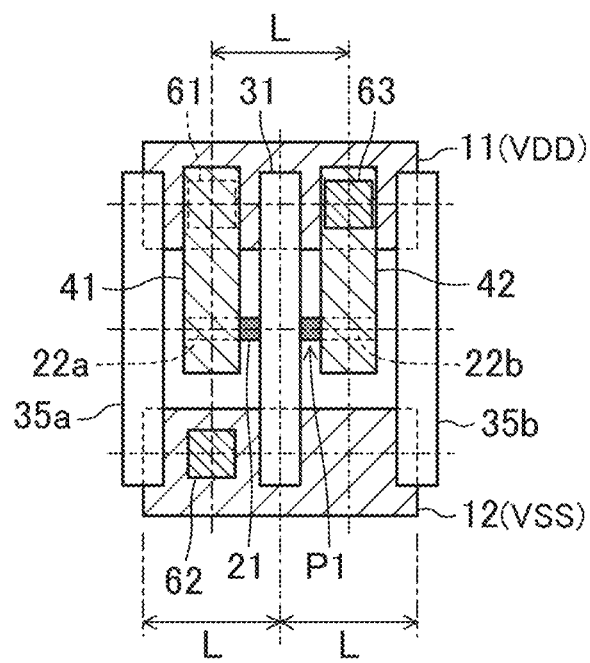
FIG.4A
LOWER PART(Pch)
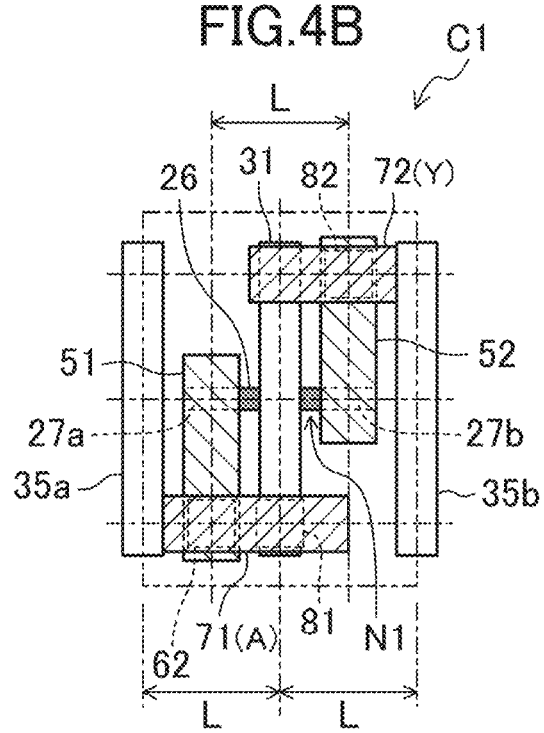
FIG.4B
UPPER PART(Nch)
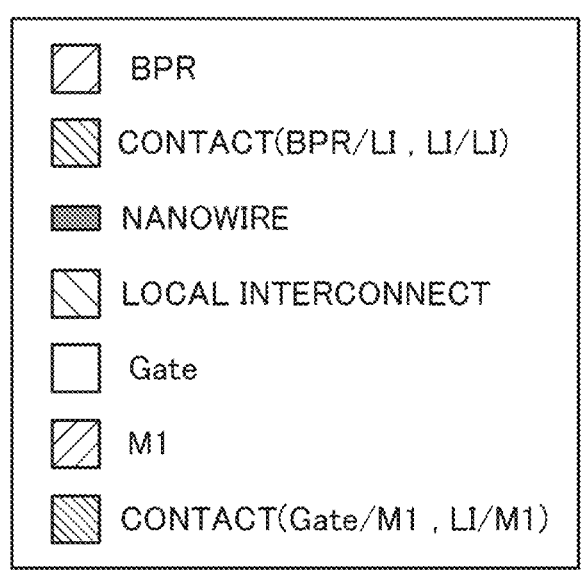

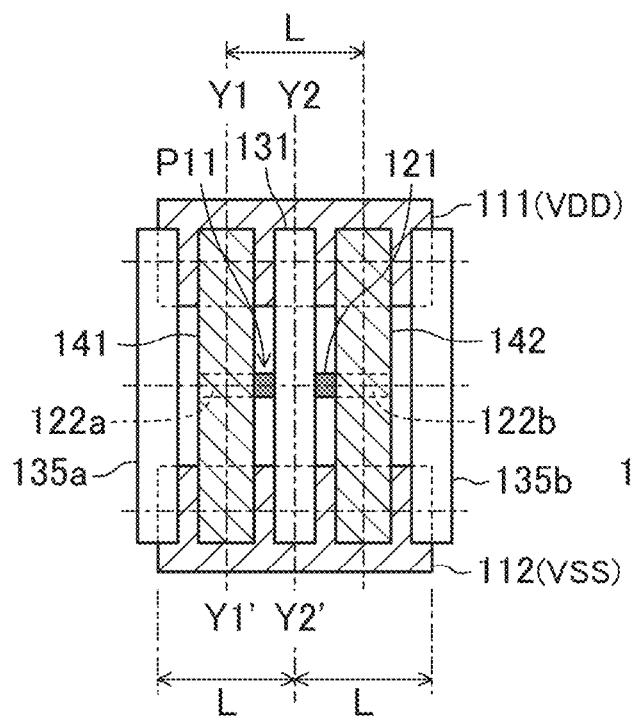
FIG.5A
LOWER PART(Pch)
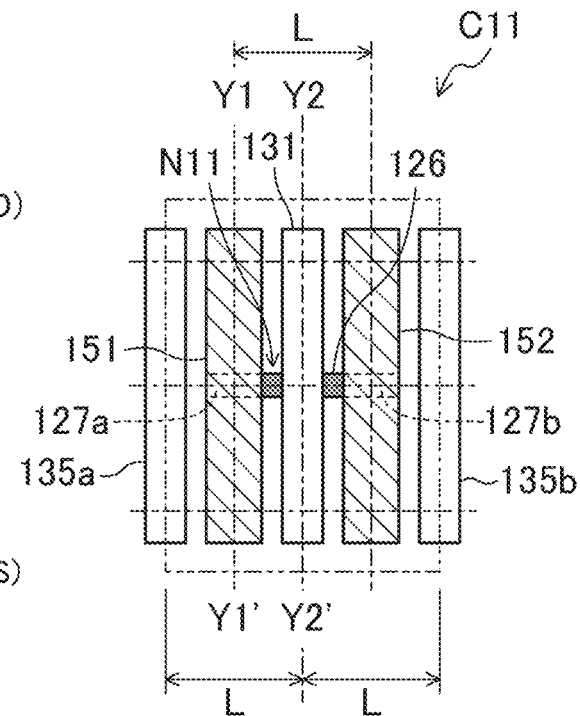
FIG.5B
UPPER PART(Nch)
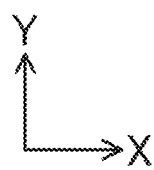
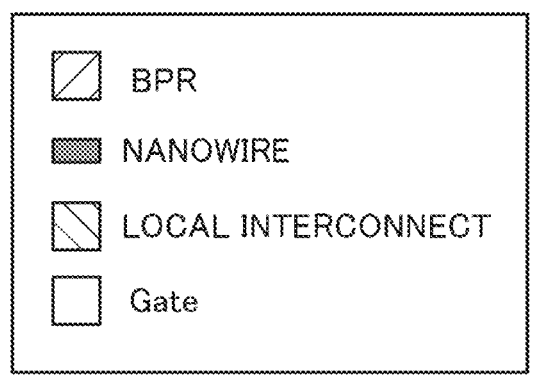

FIG.6A 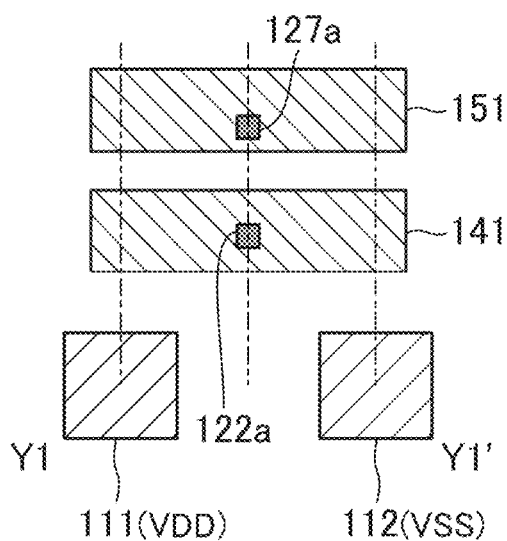 FIG.6B 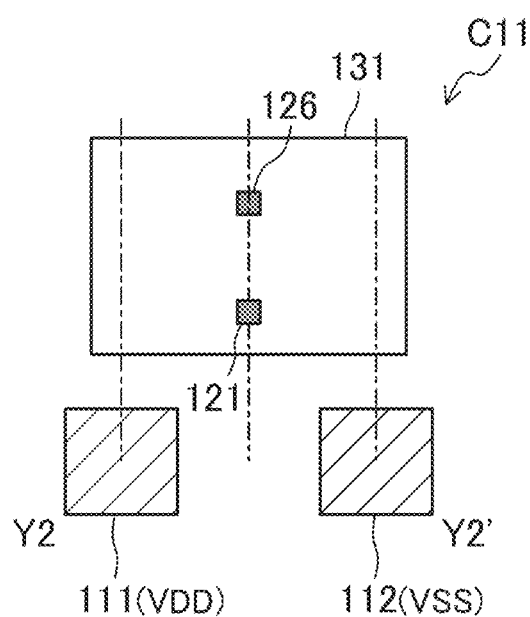
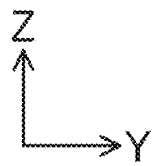 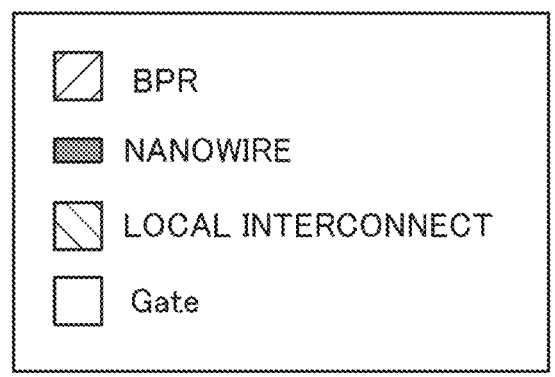

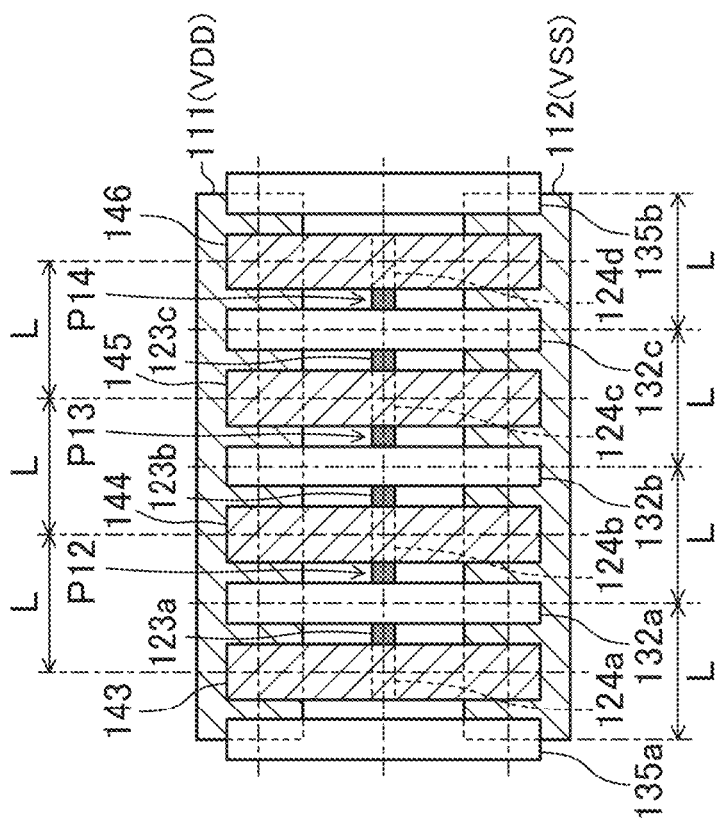
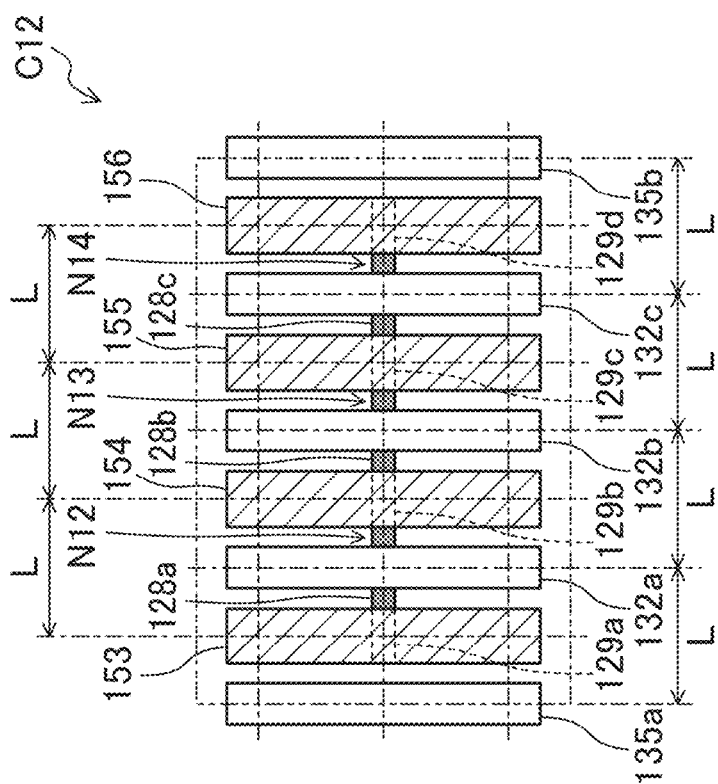
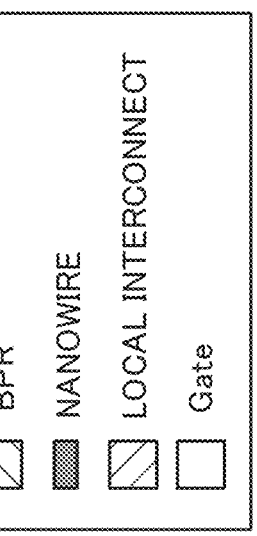
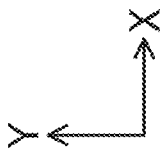

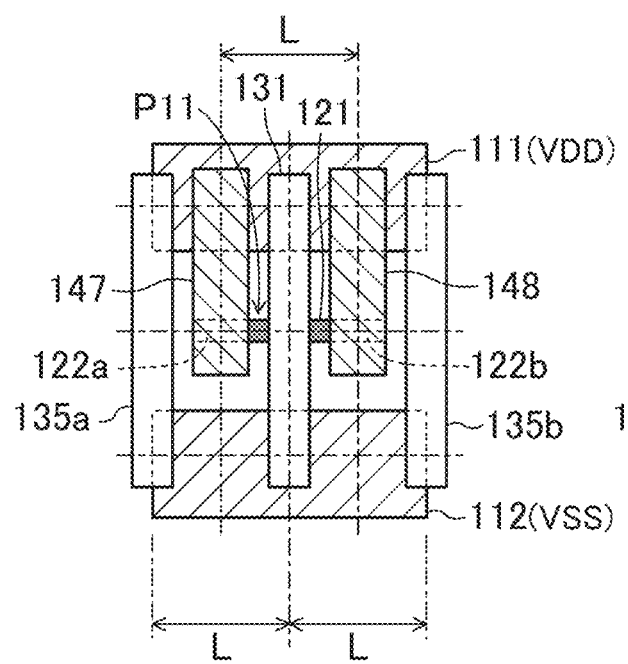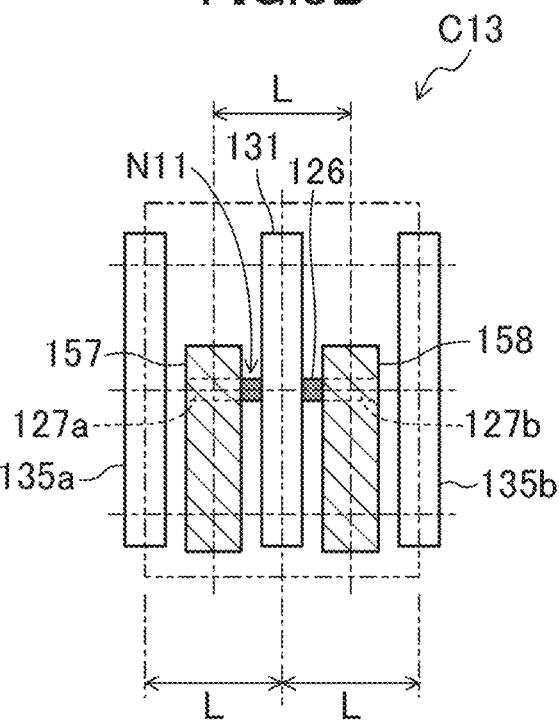
FIG.8A LOWER PART(Pch)
FIG.8B UPPER PART(Nch)

FIG.9A
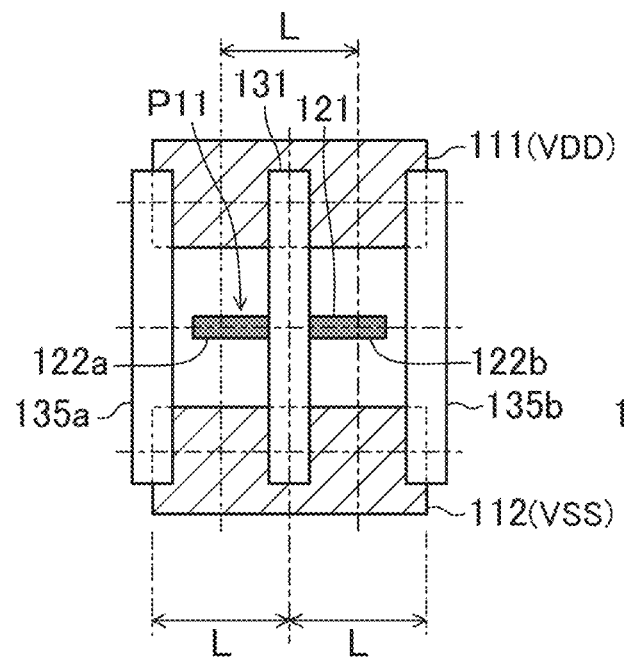
LOWER PART(Pch)
FIG.9B
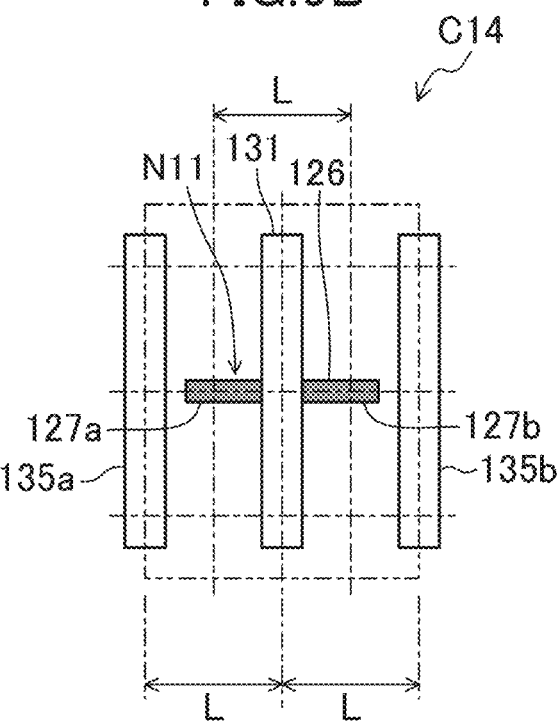
UPPER PART(Nch)
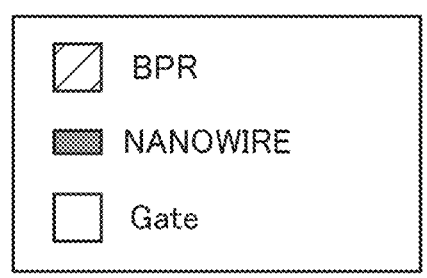

LOWER PART(Pch)
UPPER PART(Nch)
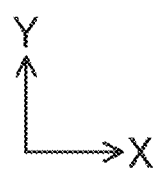
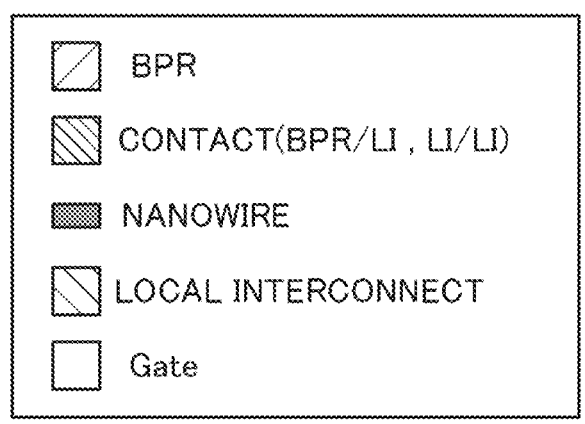

FIG.11A
FIG.11B
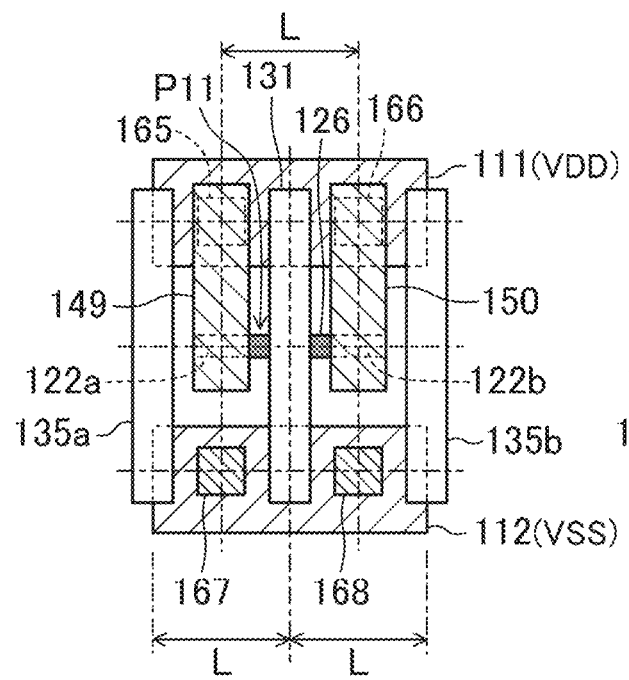
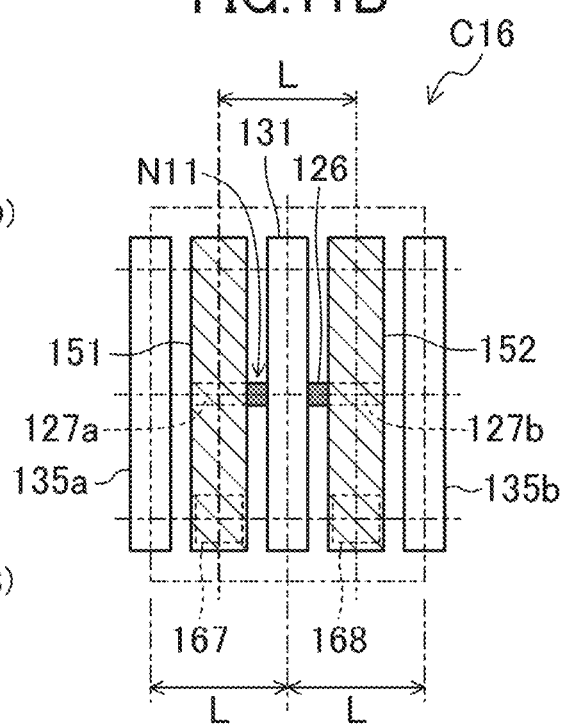
LOWER PART(Pch)
UPPER PART(Nch)
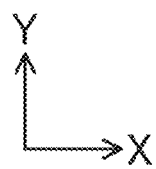
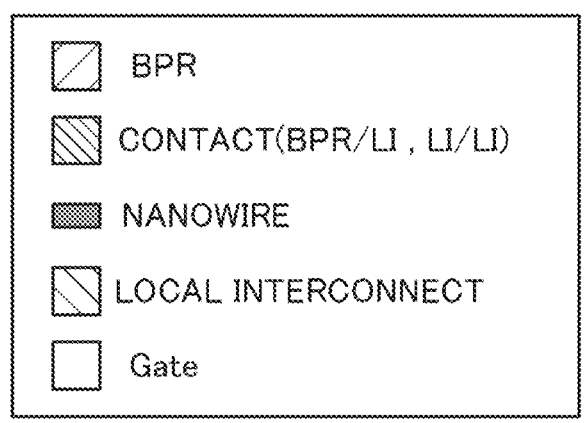

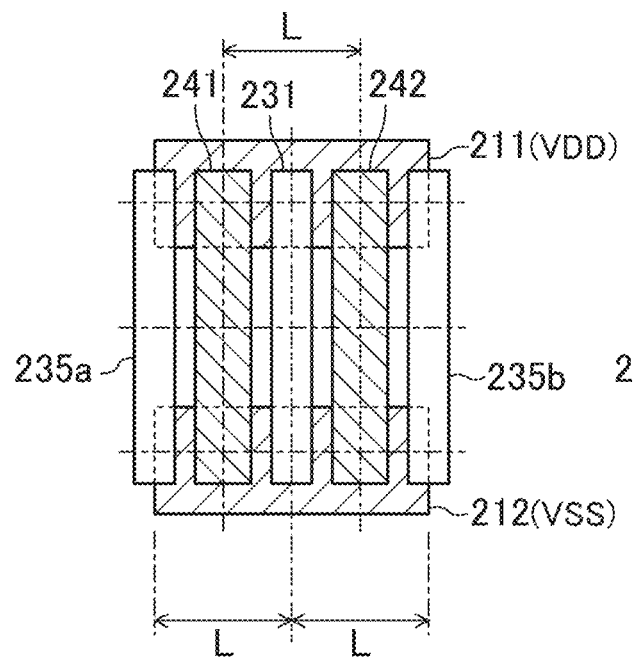
FIG.12A
LOWER PART(Pch)
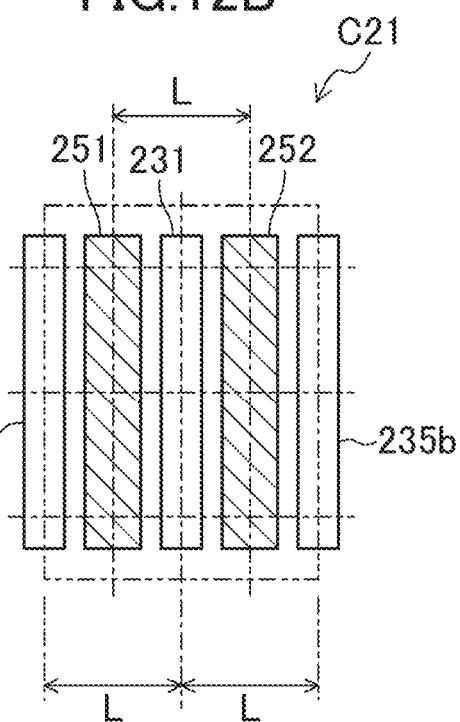
FIG.12B
UPPER PART(Nch)
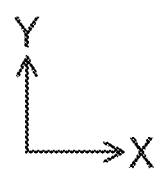
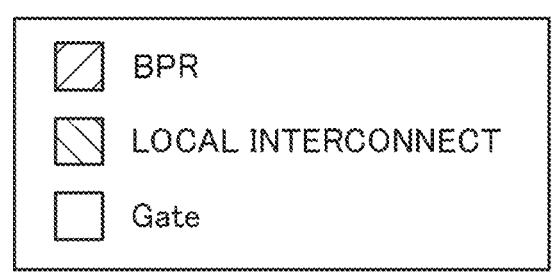

FIG.13A
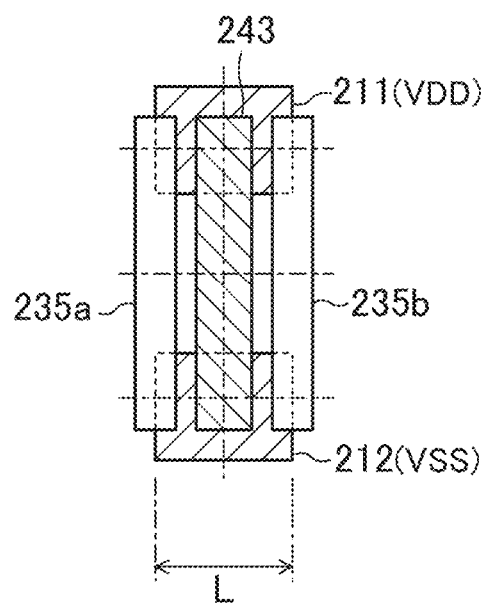
LOWER PART(Pch)
FIG.13B
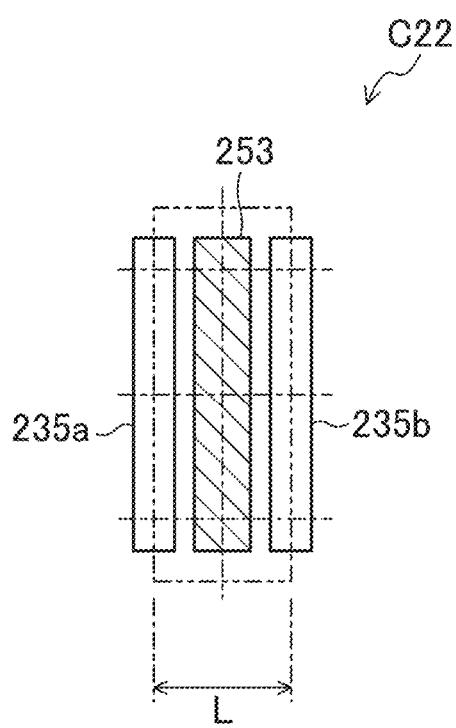
UPPER PART(Nch)
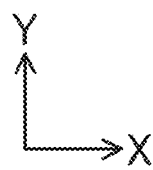
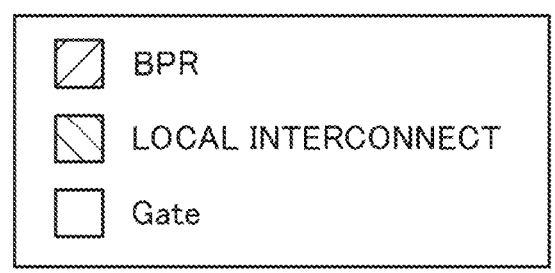

FIG.14A
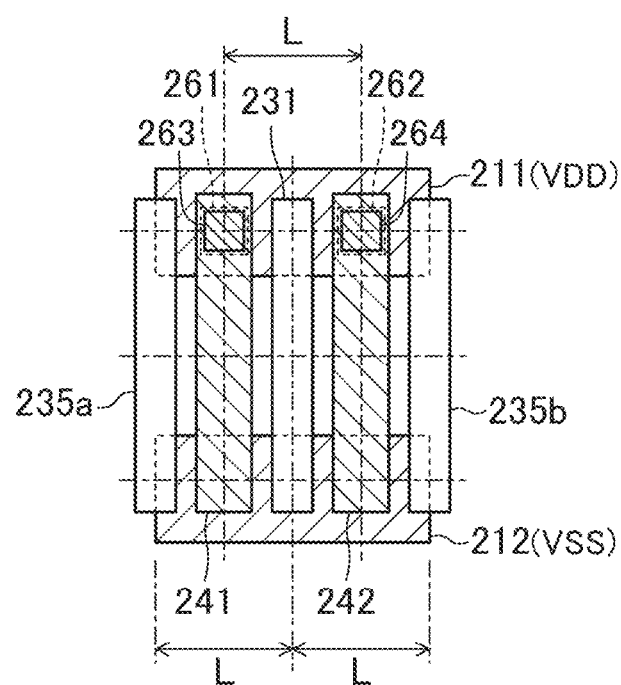
LOWER PART(Pch)
FIG.14B
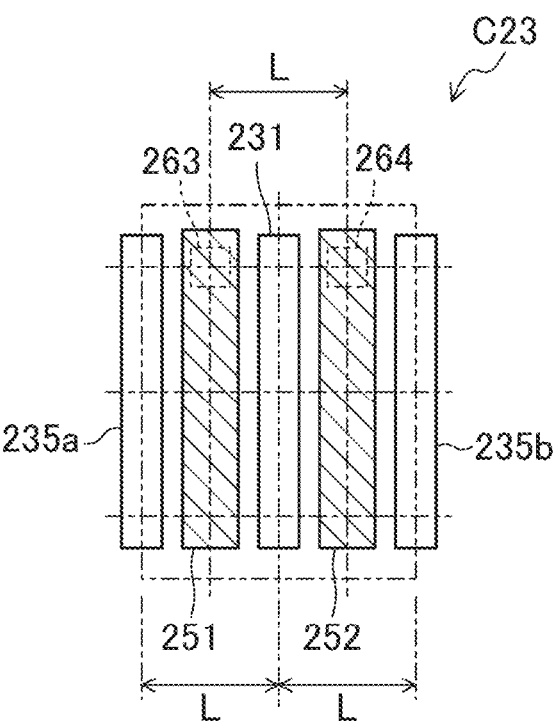
UPPER PART(Nch)
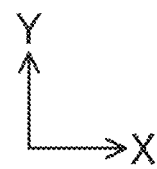

FIG.15A
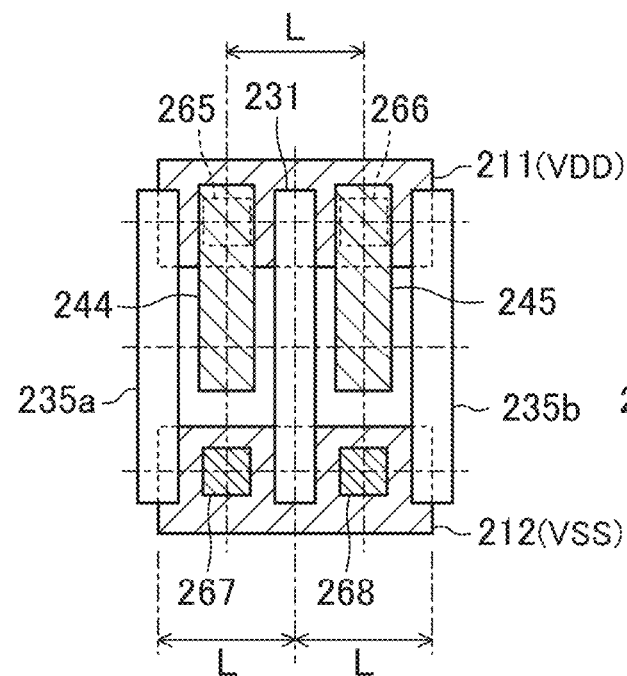
LOWER PART(Pch)
FIG.15B
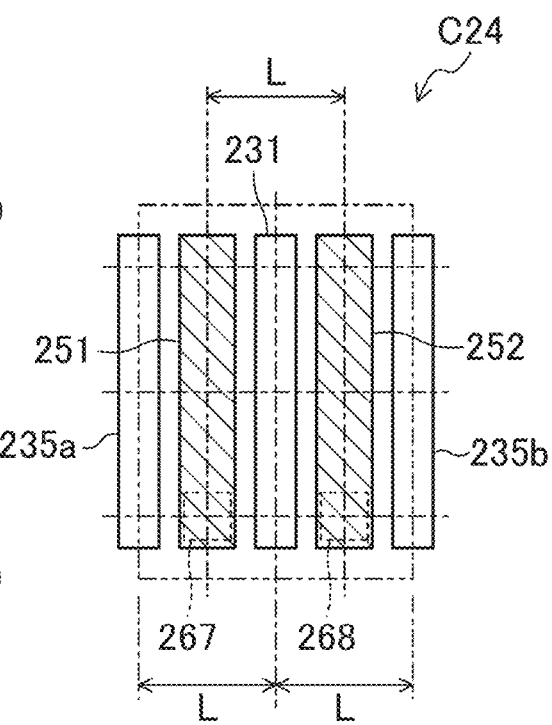
UPPER PART(Nch)
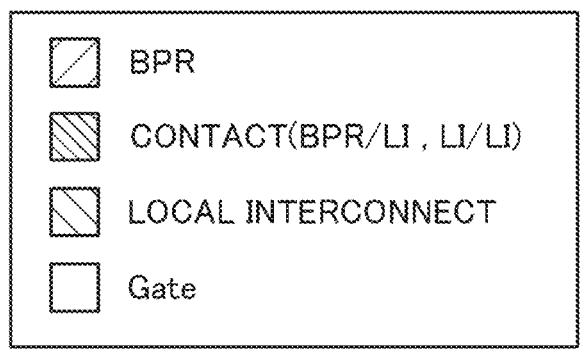

SEMICONDUCTOR INTEGRATED CIRCUIT DEVICE

CROSS-REFERENCE TO RELATED APPLICATIONS

This is a continuation of International Application No. PCT/JP2019/049190 filed on Dec. 16, 2019, which claims priority to Japanese Patent Application No. 2018-240887 filed on Dec. 25, 2018. The entire disclosures of these applications are incorporated by reference herein.

BACKGROUND

The present disclosure relates to a semiconductor integrated circuit device provided with standard cells (hereinafter simply called cells as appropriate) including three-dimensional transistors.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

A three-dimensional device in which three-dimensional p-type FET and n-type FET are stacked vertically to a substrate is herein called a complementary FET (CFET) following the cited paper by Ryckaert J. et al. Also, the direction perpendicular to the substrate is herein called the depth direction.

Standard cells include cells having no logical function, in addition to cells having a logical function (hereinafter called logical cells as appropriate) such as a NAND gate and a NOR gate, for example. An example of such cells having no logical function is a "filler cell." The "filler cell" is a cell placed between logical cells, having no logical function nor contributing to the logical function of the circuit block.

No concrete examination has been made so far on the structure of a filler cell using a CFET or on the layout of a semiconductor integrated circuit including a filler cell using a CFET.

An objective of the present disclosure is providing a layout of a semiconductor integrated circuit device including a filler cell using a CFET.

SUMMARY

In the first mode of the present disclosure, a semiconductor integrated circuit device provided with a first standard cell having a logical function and a second standard cell having no logical function placed adjacent to the first standard cell is provided. The first standard cell includes: a first power supply line extending in a first direction and supplying a first power supply voltage; a second power supply line extending in the first direction and supplying a second power supply voltage different from the first power supply voltage; a first transistor that is a three-dimensional transistor of a first conductivity type; and a second transistor that is a three-dimensional transistor of a second conductivity type, formed at a position higher than the first transistor in a depth direction, a channel portion thereof being placed at a position overlapping a channel portion of the first transistor as viewed in plan, and the second standard cell includes: a third power supply line extending in the first direction and supplying the first power supply voltage; a fourth power supply line extending in the first direction and supplying the second power supply voltage; a first dummy transistor that is a three-dimensional transistor of the first conductivity type, a channel portion thereof being placed at a same position as the channel portion of the first transistor in a second direction perpendicular to the first direction, the first dummy transistor being placed at a same level as the first transistor in the depth direction; and a second dummy transistor that is a three-dimensional transistor of the second conductivity type, a channel portion thereof being placed at a same position as the channel portion of the second transistor in the second direction, the second dummy transistor being placed at a same level as the second transistor in the depth direction.

According to the above mode, the channel portions of the first transistor and the first dummy transistor are placed at the same position in the second direction, and the first transistor and the first dummy transistor are placed at the same level in the depth direction. Also, the channel portions of the second transistor and the second dummy transistor are placed at the same position in the second direction, and the second transistor and the second dummy transistor are placed at the same level in the depth direction. That is, by placing the first and second dummy transistors in the second standard cell, unevenness in the density of transistor placement can be avoided or reduced. It is therefore possible to prevent or reduce variations in fabrication and improve the yield in the semiconductor integrated circuit device.

In the second mode of the present disclosure, a semiconductor integrated circuit device provided with a first standard cell having a logical function and a second standard cell having no logical function placed adjacent to the first standard cell is provided. The first standard cell includes: a first power supply line extending in a first direction and supplying a first power supply voltage; a second power supply line extending in the first direction and supplying a second power supply voltage different from the first power supply voltage; a first transistor that is a three-dimensional transistor of a first conductivity type; a second transistor that is a three-dimensional transistor of a second conductivity type, formed at a position higher than the first transistor in a depth direction, a channel portion thereof being placed at a position overlapping a channel portion of the first transistor as viewed in plan; first and second local interconnects extending in a second direction perpendicular to the first direction, respectively connected to a source and drain of the first transistor; and third and fourth local interconnects extending in the second direction, respectively connected to a source and drain of the second transistor, and the second standard cell includes: a third power supply line extending in the first direction and supplying the first power supply voltage; a fourth power supply line extending in the first direction and supplying the second power supply voltage; a fifth local interconnect placed at a same level as the first and second local interconnects in the depth direction; and a sixth local interconnect placed at a same level as the third and fourth local interconnects in the depth direction, wherein at least one of the fifth and sixth local interconnects has overlaps with the third and fourth power supply lines as viewed in plan.

According to the above mode, the first standard cell and the second standard cell are placed adjacent to each other. Also, the first, second, and fifth local interconnects are placed at the same level, and the third, fourth, and sixth local interconnects are placed at the same level. That is, the first, second, and fifth local interconnects are placed regularly in the lower part of the semiconductor integrated circuit device, and the third, fourth, and sixth local interconnects are placed regularly in the upper part of the semiconductor integrated circuit device. It is therefore possible to prevent or reduce variations in fabrication and improve the yield in the semiconductor integrated circuit device.

According to the present disclosure, in a semiconductor integrated circuit device using a CFET, it is possible to prevent or reduce variations in fabrication and performance, and also improve the yield.

BRIEF DESCRIPTION OF THE DRAWINGS

FIG. 1 is a plan view showing an example of the layout structure of a lower part of a circuit block using standard cells according to the first embodiment.

FIG. 3 is a cross-sectional view of the layout structures of FIGS. 1 and 2 taken in the horizontal direction as viewed in plan.

FIGS. 4A and 4B are plan views showing a layout structure of an inverter cell according to the first embodiment.

FIGS. 5A and 5B are plan views showing a layout structure of a filler cell according to the first embodiment.

FIGS. 6A and 6B are cross-sectional views of the layout structure of FIGS. 5A and 5B taken in the vertical direction as viewed in plan.

FIGS. 7A and 7B are plan views showing another layout structure of the filler cell according to the first embodiment.

FIGS. 8A and 8B are plan views showing yet another layout structure of the filler cell according to the first embodiment.

FIGS. 9A and 9B are plan views showing yet another layout structure of the filler cell according to the first embodiment.

FIGS. 11A and 11B are plan views showing yet another layout structure of the filler cell according to the first embodiment.

FIGS. 12A and 12B are plan views showing a layout structure of a filler cell according to the second embodiment.

FIGS. 13A and 13B are plan views showing another layout structure of the filler cell according to the second embodiment.

FIGS. 14A and 14B are plan views showing yet another layout structure of the filler cell according to the second embodiment.

FIGS. 15A and 15B are plan views showing yet another layout structure of the filler cell according to the second embodiment.

DETAILED DESCRIPTION

Embodiments of the present disclosure will be described hereinafter with reference to the accompanying drawings. In the following embodiments, a semiconductor integrated circuit device includes a plurality of standard cells (herein simply called cells as appropriate), and at least some of the plurality of standard cells include a CFET, that is, a three-dimensional device in which three-dimensional p-type FET and n-type FET are stacked vertically to a substrate.

Figure 16:
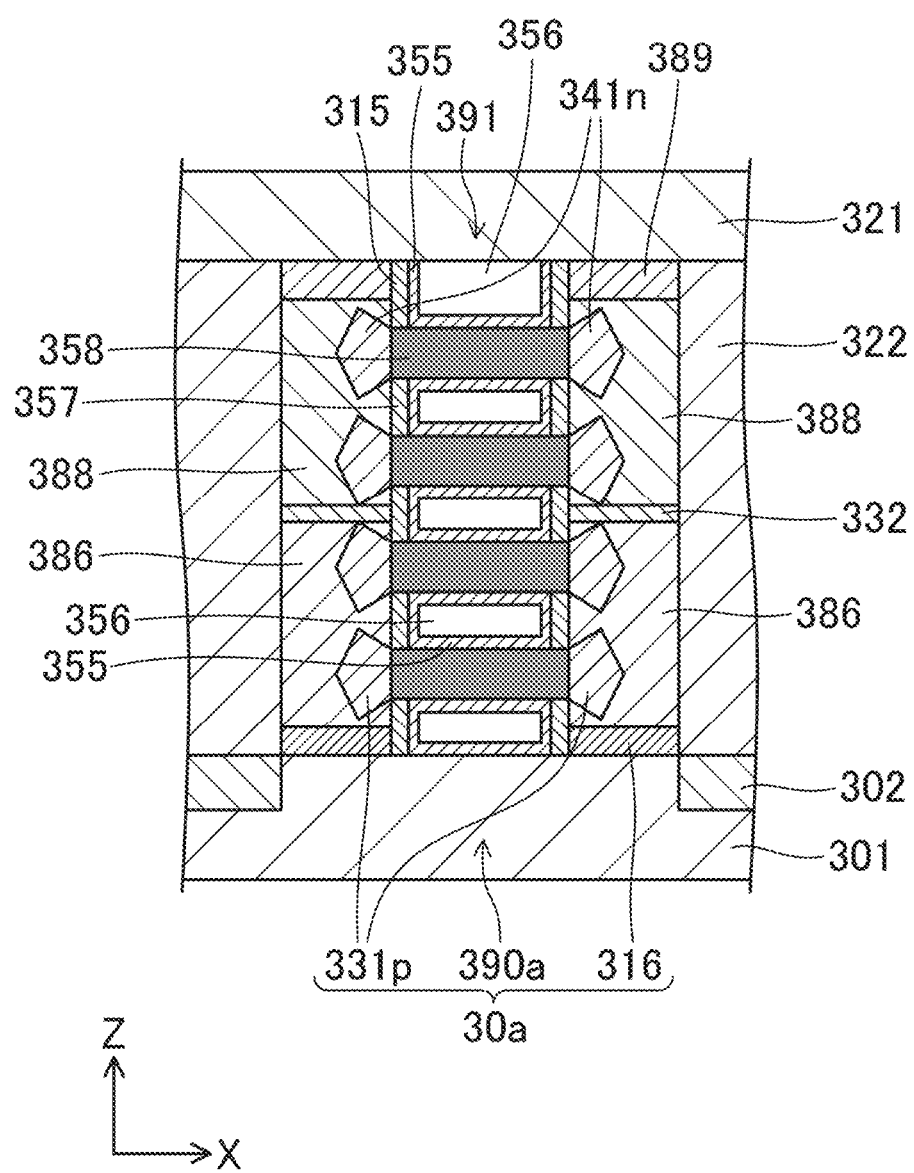
FIG. 16 is a cross-sectional view showing a structure of a semiconductor device provided with a CFET.
Figure 17:
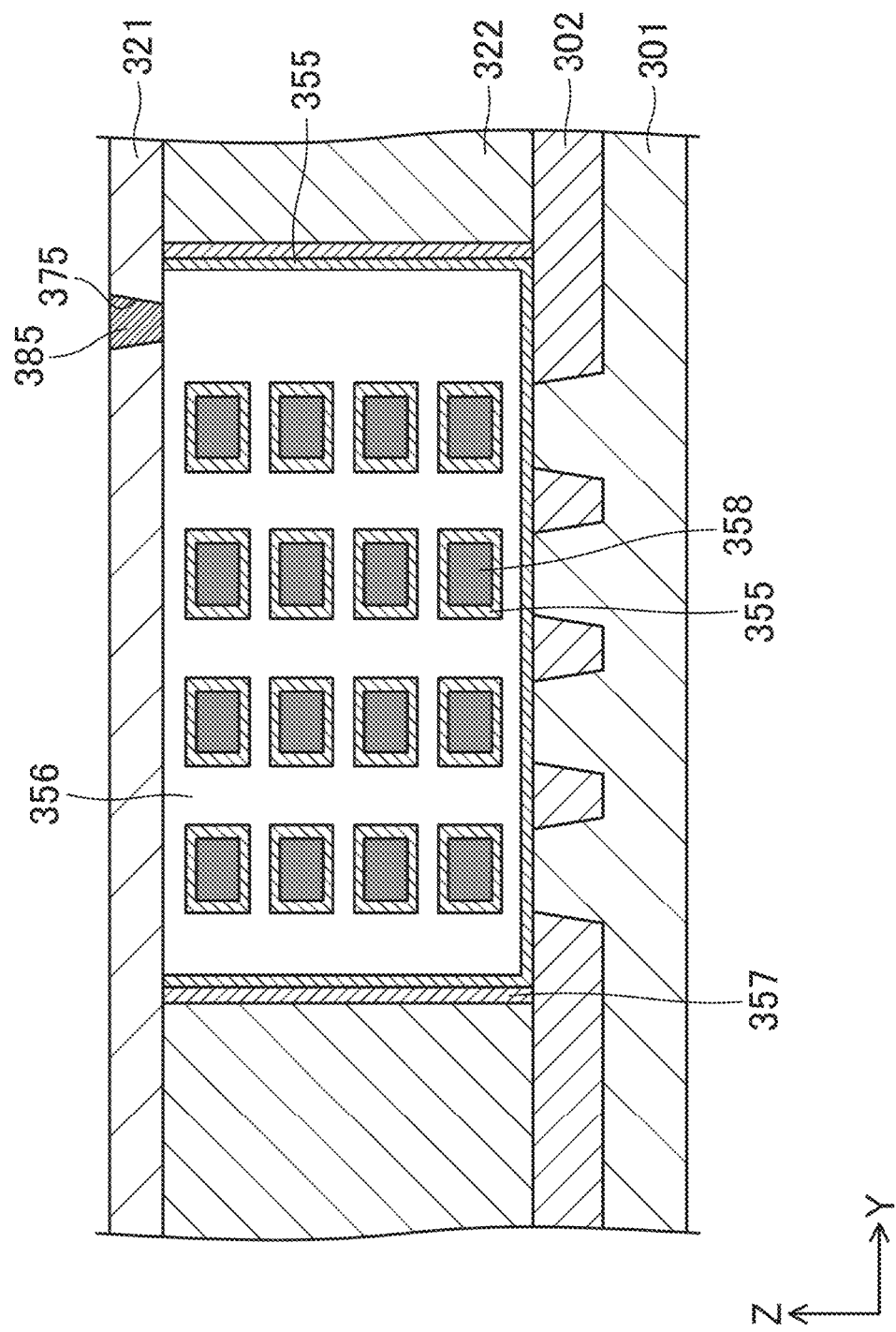
FIG. 17 is a cross-sectional view showing the structure of the semiconductor device provided with a CFET.
Figure 18:
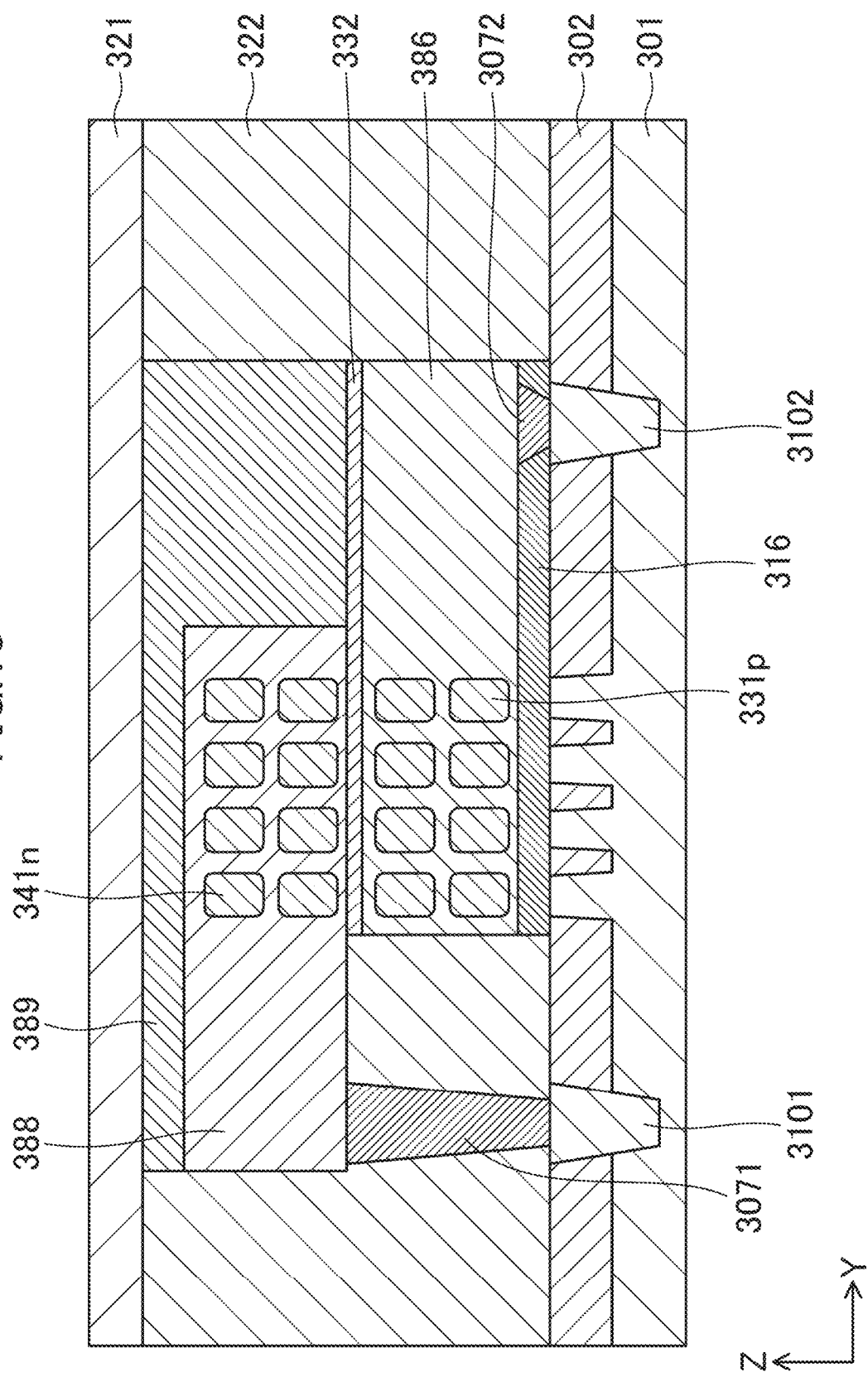
FIG. 18 is a cross-sectional view showing the structure of the semiconductor device provided with a CFET.
Figure 19:
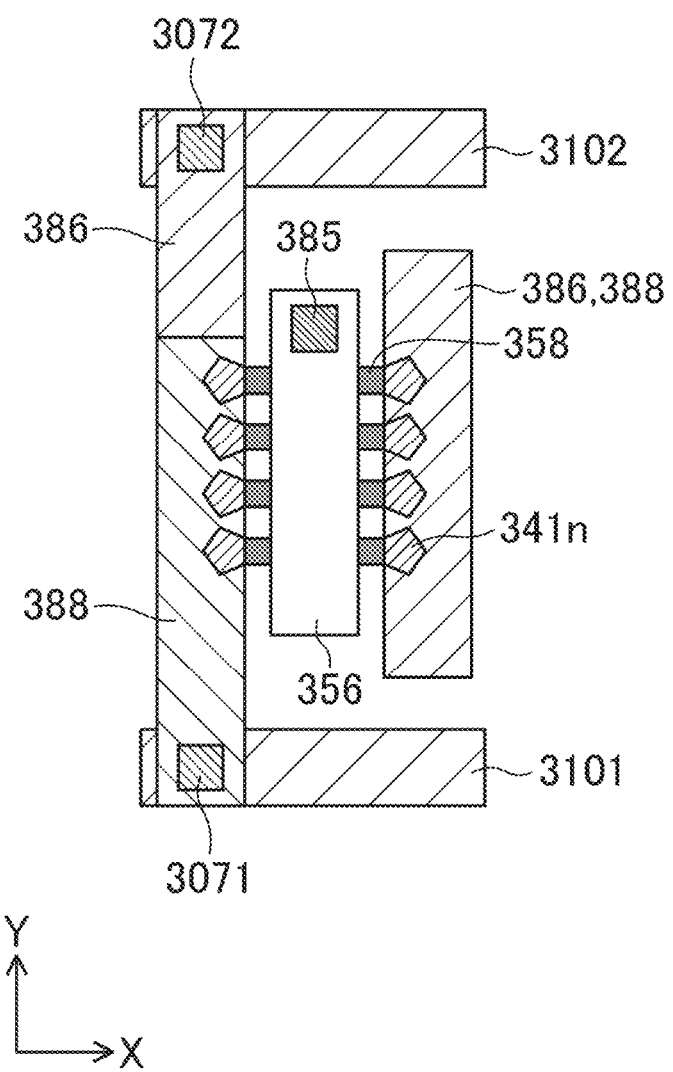
FIG. 19 is a plan view showing the structure of the semiconductor device provided with a CFET.

First, the basic structure of the CFET will be described. FIGS. 16 to 19 are views showing a structure of a semiconductor device provided with a CFET, where FIG. 16 is a cross-sectional view taken in an X direction, FIG. 17 is a cross-sectional view of a gate portion taken in a Y direction, FIG. 18 is a cross-sectional view of a source/drain portion taken in the Y direction, and FIG. 19 is a plan view. Note that the X direction refers to the direction in which nanowires extend, the Y direction refers to the direction in which a gate extends, and a Z direction refers to the direction perpendicular to the substrate plane. Note also that FIGS. 16 to 19 are schematic views in which the dimensions and positions of the components are not necessarily consistent with one another.

In this semiconductor device, an element isolation region 302 is formed on a semiconductor substrate 301 such as a silicon (Si) substrate, and an element active region 30*a* is defined by the element isolation region 302. In the element active region 30*a*, an n-type FET is formed above a p-type FET.

In the element active region 30*a*, a stacked transistor structure 390*a* is formed on the semiconductor substrate 301. The stacked transistor structure 390*a* includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 17, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 18, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

A semiconductor layer portion formed on each end of a nanowire to constitute a terminal that is to be the source or drain of a transistor is herein called a "pad." In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads on both ends of the nanowires may be illustrated in simplified linear shapes in some cases. Also, as used herein, an expression indicating that sizes, etc. are identical, such as the "same size," is to be understood as including a range of manufacturing variations.

First Embodiment

Figure 2:
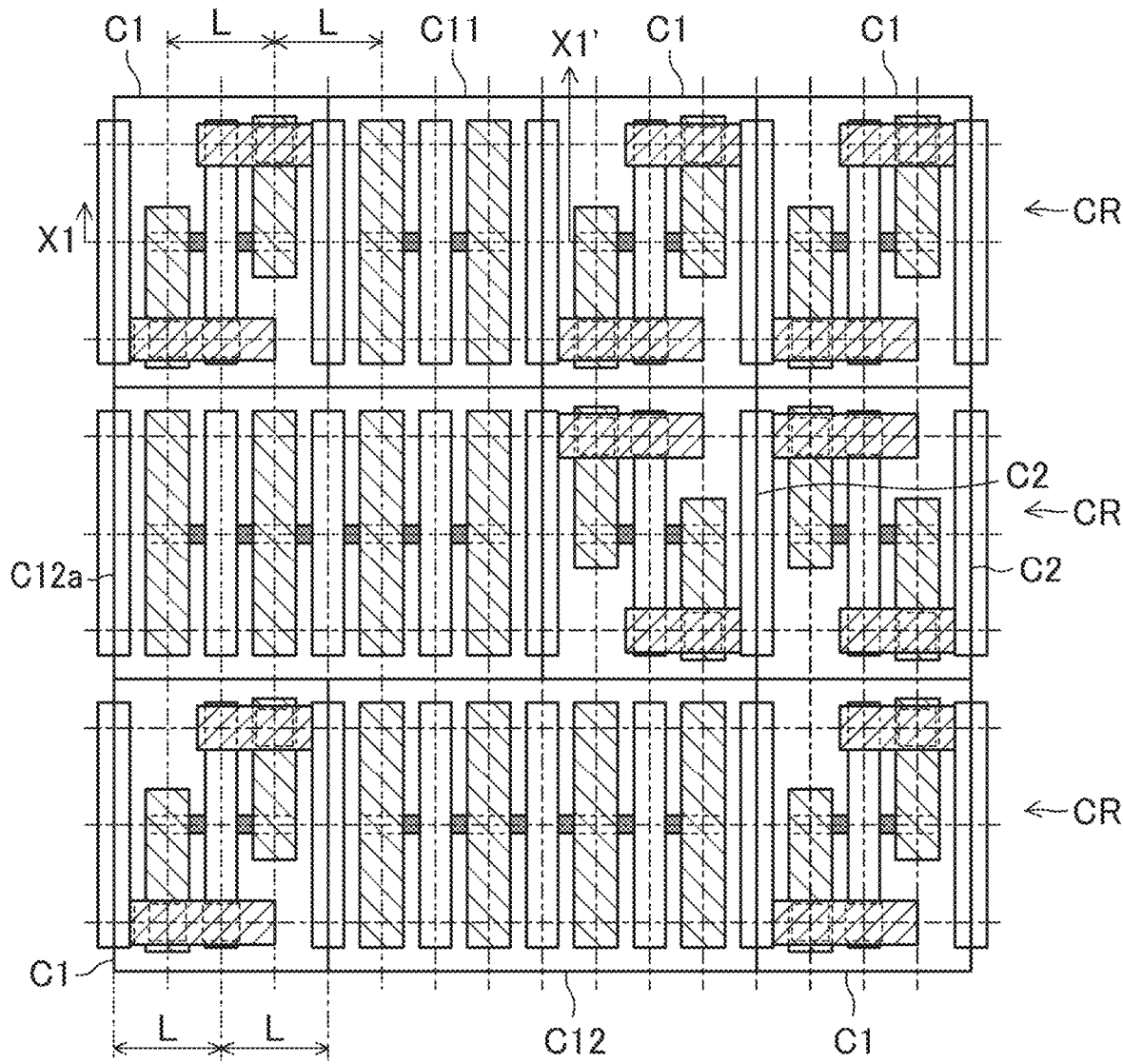
FIG. 2 is a plan view showing an example of the layout structure of an upper part of the circuit block using standard cells according to the first embodiment.

FIG. 1 shows a layout example of a lower part of a circuit block using standard cells according to the first embodiment, FIG. 2 shows a layout example of an upper part of the circuit block using standard cells according to the first embodiment, and FIG. 3 shows a cross section taken along line X1-X1' in FIGS. 1 and 2. FIGS. 1 and 2 are plan views of the circuit block. Specifically, FIG. 1 shows a lower part, i.e., a portion including three-dimensional transistors formed closer to a substrate (p-type nanowire FETs in the illustrated example), and FIG. 2 shows an upper part, i.e., a portion including three-dimensional transistors formed away from the substrate (n-type nanowire FETs in the illustrated example).

Note herein that, in the plan views such as FIG. 1, the horizontal direction is called the X direction (corresponding to the first direction) and the vertical direction is called the Y direction (corresponding to the second direction). The direction perpendicular to the substrate plane is called the Z direction (corresponding to the depth direction). Also, the dashed lines running horizontally and vertically in the plan views such as FIG. 1 represent grid lines used for placement of components at the time of designing. The grid lines are placed at equal spacings in the X direction and placed at equal spacings in the Y direction. The grid spacings in the X and Y directions may be the same, or different from each other.

In the layouts of FIGS. 1 and 2, a plurality of cells arranged in the X direction constitute a cell row CR, and a plurality of cell rows CR are arranged in the Y direction. The plurality of cells include inverter cells C1 and C2 having a logical function of an inverter and filler cells C11, C12, and C12a having no logical function. The inverter cell C2 is an inverted one of the inverter cell C1 in the Y direction, and the filler cell C12a is an inverted one of the filler cell C12 in the Y direction.

The "filler cell" as used herein refers to a cell placed between logical cells, having no logical function nor contributing to the logical function of the circuit block.

In this embodiment, dummy pads are placed in the filler cell. The "dummy pad" as used herein refers to a pad that does not contribute to the logical function of the circuit, i.e., a component that has a structure similar to a pad constituting a nanowire FET but does not contribute to the logical function of the circuit block.

Note that while FIGS. 1 and 2 illustrate a layout of a circuit block including the inverter cells C1 and C2 and the filler cells C11, C12, and C12a, the actual layout is not limited to this, but may include any logical cells.

(Configuration of Inverter Cell)

FIGS. 4A and 4B are plan views showing a layout structure of an inverter cell. Specifically, FIGS. 4A and 4B are plan views showing the inverter cell C1, where FIG. 4A shows a lower part and FIG. 4B shows an upper part.

As shown in FIG. 4A, power supply lines 11 and 12 extending in the X direction are provided on both ends of the inverter cell C1 in the Y direction. The power supply lines 11 and 12 are both buried power rails (BPR) formed in a buried wiring layer. The power supply line 11 supplies a power supply voltage VDD and the power supply line 12 supplies a power supply voltage VSS.

Interconnects 71 and 72 extending in the X direction are formed in an M1 wiring layer: the interconnect 71 corresponds to an input A and the interconnect 72 corresponds to an output Y.

A nanowire 21 extending in the X direction is formed in the lower part of the inverter cell C1, and a nanowire 26 extending in the X direction is formed in the upper part of the inverter cell C1. The nanowires 21 and 26 overlap each other as viewed in plan. Pads 22a and 22b doped with a p-type semiconductor are formed at both ends of the nanowire 21, and pads 27a and 27b doped with an n-type semiconductor are formed at both ends of the nanowire 26. The nanowire 21 constitutes the channel portion of a p-type transistor P1, and each of the pads 22a and 22b constitutes a terminal that is to be the source or drain of the p-type transistor P1. The nanowire 26 constitutes the channel portion of an n-type transistor N1, and each of the pads 27a and 27b constitutes a terminal that is to be the source or drain of the n-type transistor N1. The n-type transistor N1 is formed at a position higher than the p-type transistor P1 in the Z direction.

A gate interconnect 31 extends in the Y direction roughly in the center in the X direction and also extends in the Z direction over the lower and upper parts of the inverter cell C1. The gate interconnect 31 is to be the gates of the p-type transistor P1 and the n-type transistor N1. That is, the p-type transistor P1 is constituted by the nanowire 21, the gate interconnect 31, and the pads 22a and 22b, and the n-type transistor N1 is constituted by the nanowire 26, the gate interconnect 31, and the pads 27a and 27b. Also, dummy gate interconnects 35a and 35b are formed on both ends of the inverter cell C1 in the X direction. Like the gate interconnect 31, the dummy gate interconnects 35a and 35b extend in the Y and Z directions. The gate interconnect 31 and the dummy gate interconnects 35a and 35b are placed at a same pitch L in the X direction.

In the lower part of the inverter cell C1, local interconnects (LI) 41 and 42 are formed to extend in the Y direction. The local interconnect 41 is connected with the pad 22a, and the local interconnect 42 is connected with the pad 22b. In the upper part of the inverter cell C1, local interconnects 51 and 52 are formed to extend in the Y direction. The local interconnect 51 is connected with the pad 27a, and the local interconnect 52 is connected with the pad 27b.

The local interconnect 41 extends up to a position overlapping the power supply line 11 as viewed in plan and is connected with the power supply line 11 through a contact 61. The contact 61 is formed at a position where the power supply line 11 and the local interconnect 41 overlap each other as viewed in plan. The local interconnect 51 extends up to a position overlapping the power supply line 12 as viewed in plan and is connected with the power supply line 12 through a contact 62. The contact 62 is formed at a position where the power supply line 12 and the local interconnect 51 overlap each other as viewed in plan. The local interconnects 42 and 52 are mutually connected through a contact 63. The contact 63 is formed at a position where the local interconnects 42 and 52 overlap each other as viewed in plan.

As shown in FIG. 4B, the interconnect 71 (input A) is connected with the gate interconnect 31 through a contact 81, and the interconnect 72 (output Y) is connected with the local interconnect 52 through a contact 82.

As described above, the inverter cell C1 has the p-type transistor P1 and the n-type transistor N1, implementing an inverter circuit having the input A and the output Y. In other words, the inverter cell C1 is a standard cell having a logical function.

(Configuration of Filler Cell)

FIGS. 5A and 5B are plan views showing a layout structure of a filler cell, and FIGS. 6A and 6B are cross-sectional views taken in the vertical direction as viewed in plan. Specifically, FIG. 5A shows a lower part of the filler cell C11 and FIG. 5B shows an upper part thereof. FIG. 6A shows a cross section taken along line Y1-Y1' and FIG. 6B shows a cross section taken along line Y2-Y2'.

As shown in FIG. 5A, power supply lines 111 and 112 extending in the X direction are provided on both ends of the filler cell C11 in the Y direction. The power supply lines 111 and 112 are both buried power rails (BPR) formed in a buried wiring layer. The power supply line 111 supplies the same power supply voltage VDD as the power supply line 11, and the power supply line 112 supplies the same power supply voltage VSS as the power supply line 12.

A nanowire 121 extending in the X direction is formed in the lower part of the filler cell C11, and a nanowire 126 extending in the X direction is formed in the upper part of the filler cell C11. The nanowires 121 and 126 overlap each other as viewed in plan. Dummy pads 122a and 122b doped with a p-type semiconductor are formed at both ends of the nanowire 121, and dummy pads 127a and 127b doped with an n-type semiconductor are formed at both ends of the nanowire 126. The nanowire 121 constitutes the channel portion of a p-type dummy transistor P11, and each of the dummy pads 122a and 122b constitutes a terminal that is to be the source or drain of the p-type dummy transistor P11. The nanowire 126 constitutes the channel portion of an n-type dummy transistor N1, and each of the dummy pads 127a and 127b constitutes a terminal that is to be the source or drain of the n-type dummy transistor N11. The n-type dummy transistor N11 is formed at a position higher than the p-type dummy transistor P11 in the Z direction.

A dummy gate interconnect 131 is formed to extend in the Y direction roughly in the center in the X direction and also extend in the Z direction over the lower and upper parts of the filler cell C11. Also, dummy gate interconnects 135a and 135b are formed on both ends of the filler cell C11 in the X direction. The dummy gate interconnects 135a and 135b extend in the Y direction and also extend in the Z direction over the lower and upper parts of the cell. The dummy gate interconnects 131, 135a, and 135b are placed at a same pitch L in the X direction.

The dummy gate interconnect 131 is to be the gates of the p-type dummy transistor P11 and the n-type dummy transistor N11. That is, the p-type dummy transistor P11 is constituted by the nanowire 121, the dummy gate interconnect 131, and the dummy pads 122a and 122b, and the n-type dummy transistor N11 is constituted by the nanowire 126, the dummy gate interconnect 131, and the dummy pads 127a and 127b.

In the lower part of the filler cell C11, local interconnects 141 and 142 are formed to extend in the Y direction. The local interconnects 141 and 142 both have overlaps with the power supply lines 111 and 112 as viewed in plan. The local interconnect 141 is connected with the dummy pad 122a, and the local interconnect 142 is connected with the dummy pad 122b.

In the upper part of the filler cell C11, local interconnects 151 and 152 are formed to extend in the Y direction. The local interconnect 151 and 152 both have overlaps with the power supply lines 111 and 112 as viewed in plan. The local interconnect 151 is connected with the dummy pad 127a, and the local interconnect 152 is connected with the dummy pad 127b.

Unlike the inverter cell C1, none of the dummy gate interconnect 131 and the local interconnects 141, 142, 151, and 152 are connected with other interconnects.

As described above, the filler cell C11 has the p-type dummy transistor P11 and the n-type dummy transistor N11. The dummy pads 122a, 122b, 127a, and 127b that are to be the sources or drains of the p-type dummy transistor P11 and the n-type dummy transistor N11 are connected with the local interconnects 141, 142, 151, and 152, respectively. However, none of the local interconnects 141, 142, 151, and 152 are connected with other interconnects. That is, the filler cell C11 is a standard cell having no logical function.

As shown in FIG. 3, the inverter cell C1 and the filler cell C11 are placed side by side in the X direction. Note that the dummy gate interconnect placed at the boundary between the inverter cell C1 and the filler cell C11 corresponds to the dummy gate interconnect 35b of the inverter cell C1 and the dummy gate interconnect 135a of the filler cell C11.

The nanowires 121 and 126 of the filler cell C11 are placed at the same positions in the Y direction as the nanowires 21 and 26 of the inverter cell C1, respectively. Also, the nanowires 121 and 126 are placed at the same levels in the Z direction as the nanowires 21 and 26, respectively. That is, the p-type dummy transistor P11 and the n-type dummy transistor N11 of the filler cell C11 are placed side by side in the X direction with, and also placed at the same levels in the Z direction as, the p-type transistor P1 and the n-type transistor N1 of the inverter cell C1, respectively.

The gate interconnect 31, the dummy gate interconnect 131, and the dummy gate interconnects 35a, 35b (135a), and 135b are placed at the same pitch L in the X direction. That is, the gate interconnect 31, the dummy gate interconnect 131, and the dummy gate interconnects 35a, 35b (135a), and 135b are placed at equal width, at equal spacings, and at an equal pitch (pitch L) in the X direction.

The local interconnects 141 and 142 are placed at the same level in the Z direction, and also placed at the same pitch L in the X direction, as the local interconnects 41 and 42. That is, the local interconnects 41, 42, 141, and 142 are placed at equal width, at equal spacings, and at an equal pitch (pitch L) in the X direction.

Also, the local interconnects 151 and 152 are placed at the same level in the Z direction, and also placed at the same pitch L in the X direction, as the local interconnects 51 and 52. That is, the local interconnects 51, 52, 151, and 152 are placed at equal width, at equal spacings, and at an equal pitch (pitch L) in the X direction.

Having the configuration described above, the filler cell C11 having no logical function is placed adjacent to the inverter cell C1 having a logical function. The inverter cell C1 includes the p-type transistor P1 and the n-type transistor N1 placed at a position higher than the p-type transistor P1 in the Z direction. The filler cell C11 includes the p-type dummy transistor P11 and the n-type dummy transistor N11. The nanowires 121 and 126 of the filler cell C11 are placed at the same positions in the Y direction as the nanowires 21 and 26 of the inverter cell C1, respectively. The p-type transistor P1 and the p-type dummy transistor P11 are placed at the same level in the Z direction, and the n-type transistor N1 and the n-type dummy transistor N11 are placed at the same level in the Z direction. That is, by placing the p-type and n-type dummy transistors in the filler cell C11, unevenness in the density of transistor placement can be avoided or reduced. It is therefore possible to prevent or reduce variations in fabrication and improve the yield in the semiconductor integrated circuit device using a CFET.

In the X direction, transistors closest to the p-type transistor P1 and n-type transistor N1 of the inverter cell C1 are the p-type dummy transistor P11 and n-type dummy transistor N11 of the filler cell C11, respectively. Therefore, with the presence of the p-type dummy transistor P11 and the n-type dummy transistor N11, the distances of the p-type transistor P1 and the n-type transistor N1 to their adjacent transistors are fixed to a prescribed value. In other words, with the presence of the p-type dummy transistor P11 and the n-type dummy transistor N11, the distance from transistors (the p-type transistor P1 and the n-type transistor N1) closest to a cell end of a logical cell (the inverter cell C1) to their adjacent transistors can be estimated at a prescribed value. This can improve the estimation precision of transistor performance of the logical cell.

The gate interconnect 31 of the inverter cell C1, the dummy gate interconnect 131 of the filler cell C11, and the dummy gate interconnects 35a, 35b (135a), and 135b are placed at the same pitch L in the X direction. That is, the gate interconnect 31, the dummy gate interconnect 131, and the dummy gate interconnects 35a, 35b (135a), and 135b are placed regularly. This makes it possible to prevent or reduce fabrication variations and improve the yield in the semiconductor integrated circuit device using a CFET.

The local interconnects 141 and 142 of the filler cell C11 are placed at the same level in the Z direction, and also placed at the same pitch L in the X direction, as the local interconnects 41 and 42 of the inverter cell C1. Also, the local interconnects 151 and 152 of the filler cell C11 are placed at the same level in the Z direction, and also placed at the same pitch L in the X direction, as the local interconnects 51 and 52 of the inverter cell C1. That is, the local interconnects 41, 42, 141, and 142 are placed regularly, and the local interconnects 51, 52, 151, and 152 are placed regularly. This makes it possible to prevent or reduce fabrication variations and improve the yield in the semiconductor integrated circuit device using a CFET.

(Alterations of Filler Cell)
(No. 1)

FIGS. 7A and 7B are plan views showing another example of the filler cell according to this embodiment, where FIG. 7A shows a lower part of the cell and FIG. 7B shows an upper part of the cell. As shown in FIGS. 1A and 1B and FIGS. 7A and 7B, the filler cell C12 is different in cell width (size in the X direction) from the filler cell C11. That is, while the cell width of the filler cell C11 is 2 L, the cell width of the filler cell C12 is 4 L.

Specifically, nanowires 123a, 123b, and 123c extending inn the X direction are formed in the lower part of the filler cell C12, and nanowires 128a, 128b, and 128c extending in the X direction are formed in the upper part thereof. The nanowires 123a, 123b, and 123c respectively overlap the nanowires 128a, 128b, and 128c as viewed in plan.

A dummy pad 124a doped with a p-type semiconductor is formed on the left of the nanowire 123a as viewed in the figure, and a dummy pad 124b doped with a p-type semiconductor is formed between the nanowires 123a and 123b. A dummy pad 124c doped with a p-type semiconductor is formed between the nanowires 123b and 123c, and a dummy pad 124d doped with a p-type semiconductor is formed on the right of the nanowire 123c as viewed in the figure.

Also, a dummy pad 129a doped with an n-type semiconductor is formed on the left of the nanowire 128a as viewed in the figure, and a dummy pad 129b doped with an n-type semiconductor is formed between the nanowires 128a and 128b. A dummy pad 129c doped with an n-type semiconductor is formed between the nanowires 128b and 128c, and a dummy pad 129d doped with an n-type semiconductor is formed on the right of the nanowire 128c as viewed in the figure.

The nanowire 123a constitutes the channel portion of a p-type dummy transistor P12, and each of the dummy pads 124a and 124b constitutes a terminal that is to be the source or drain of the p-type dummy transistor P12. The nanowire 123*b* constitutes the channel portion of a p-type dummy transistor P13, and each of the dummy pads 124*b* and 124*c* constitutes a terminal that is to be the source or drain of the p-type dummy transistor P13. The nanowire 123*c* constitutes the channel portion of a p-type dummy transistor P14, and each of the dummy pads 124*c* and 124*d* constitutes a terminal that is to be the source or drain of the p-type dummy transistor P14.

The nanowire 128*a* constitutes the channel portion of an n-type dummy transistor N12, and each of the dummy pads 129*a* and 129*b* constitutes a terminal that is to be the source or drain of the n-type dummy transistor N12. The nanowire 128*b* constitutes the channel portion of an n-type dummy transistor N13, and each of the dummy pads 129*b* and 129*c* constitutes a terminal that is to be the source or drain of the n-type dummy transistor N13. The nanowire 128*c* constitutes the channel portion of an n-type dummy transistor N14, and each of the dummy pads 129*c* and 129*d* constitutes a terminal that is to be the source or drain of the n-type dummy transistor N14.

The dummy gate interconnects 135*a* and 135*b* are formed on both ends of the filler cell C12 in the X direction to extend in the Y direction and also extend in the Z direction over the lower and upper parts of the cell. Also, dummy gate interconnects 132*a*, 132*b*, and 132*c* are formed between the dummy gate interconnects 135*a* and 135*b* to extend in the Y direction and also extend in the Z direction over the lower and upper parts of the cell.

The dummy gate interconnect 132*a* is to be the gates of the p-type dummy transistor P12 and the n-type dummy transistor N12. The dummy gate interconnect 132*b* is to be the gates of the p-type dummy transistor P13 and the n-type dummy transistor N13. The dummy gate interconnect 132*c* is to be the gates of the p-type dummy transistor P14 and the n-type dummy transistor N14. That is, the p-type dummy transistor P12 is constituted by the nanowire 123*a*, the dummy gate interconnect 132*a*, and the dummy pads 124*a* and 124*b*. The p-type dummy transistor P13 is constituted by the nanowire 123*b*, the dummy gate interconnect 132*b*, and the dummy pads 124*b* and 124*c*. The p-type dummy transistor P14 is constituted by the nanowire 123*c*, the dummy gate interconnect 132*c*, and the dummy pads 124*c* and 124*d*. The n-type dummy transistor N12 is constituted by the nanowire 128*a*, the dummy gate interconnect 132*a*, and the dummy pads 129*a* and 129*b*. The n-type dummy transistor N13 is constituted by the nanowire 128*b*, the dummy gate interconnect 132*b*, and the dummy pads 129*b* and 129*c*. The n-type dummy transistor N14 is constituted by the nanowire 128*c*, the dummy gate interconnect 132*c*, and the dummy pads 129*c* and 129*d*.

In the lower part of the filler cell C12, local interconnects 143 to 146 are formed to extend in the Y direction. The local interconnects 143 to 146 each have overlaps with the power supply lines 111 and 112 as viewed in plan. The local interconnects 143 to 146 are respectively connected with the dummy pads 124*a* to 124*d*. The local interconnects 143 to 146 are placed at the same pitch L in the X direction and also placed at the same level in the Z direction.

Also, in the upper part of the filler cell C12, local interconnects 153 to 156 are formed to extend in the Y direction. The local interconnects 153 to 156 each have overlaps with the power supply lines 111 and 112 as viewed in plan. The local interconnects 153 to 156 are respectively connected with the dummy pads 129*a* to 129*d*. The local interconnects 153 to 156 are placed at the same pitch L in the X direction and also placed at the same level in the Z direction.

None of the dummy gate interconnects 132*a* to 132*c* and the local interconnects 143 to 146 and 153 to 156 are connected with other interconnects.

As described above, the filler cell C12 has the p-type dummy transistors P12 to P14 and the n-type dummy transistors N12 to N14. The dummy pads 124*a* to 124*d* and 129*a* to 129*d* that are to be the sources or drains of the p-type dummy transistors P12 to P14 and the n-type dummy transistors N12 to N14 are connected with the local interconnects 143 to 145 and 153 to 156, respectively. However, none of the local interconnects 143 to 146 and 153 to 156 are connected with other interconnects. That is, the filler cell C12 is a standard cell having no logical function.

Assume here that the filler cell C12 is placed adjacent to the inverter cell C1 as shown in the circuit block of FIGS. 1 and 2. In this case, the nanowires 123*a*, 123*b*, and 123*c* of the filler cell C12 are placed at the same position in the Y direction, and also placed at the same level in the Z direction, as the nanowire 21 of the inverter cell C1. Also, the nanowires 128*a*, 128*b*, and 128*c* of the filler cell C12 are placed at the same position in the Y direction, and also placed at the same level in the Z direction, as the nanowire 26 of the inverter cell C1. That is, the p-type dummy transistors P12, P13, and P14 of the filler cell C12 are placed side by side in the X direction with, and also placed at the same level in the Z direction as, the p-type transistor P1 of the inverter cell C1. Also, the n-type dummy transistors N12, N13, and N14 of the filler cell C12 are placed side by side in the X direction with, and also placed at the same level in the Z direction as, the n-type transistor N1 of the inverter cell C1.

The gate interconnect 31, the dummy gate interconnects 132*a*, 132*b*, and 132*c*, and the dummy gate interconnects 35*a*, 35*b* (135*a*), and 135*b* are placed at the same pitch L in the X direction. That is, the gate interconnect 31, the dummy gate interconnects 132*a*, 132*b*, and 132*c*, and the dummy gate interconnects 35*a*, 35*b* (135*a*), and 135*b* are placed at equal width, at equal spacings, and at an equal pitch.

The local interconnects 143 to 146 are placed at the same pitch L in the X direction, and also placed at the same level in the Z direction, as the local interconnects 41 and 42 of the inverter cell C1. That is, the local interconnects 41, 42, and 143 to 146 are placed at equal width, at equal spacings, and at an equal pitch (pitch L).

Also, the local interconnects 153 to 156 are placed at the same pitch L in the X direction, and also placed at the same level in the Z direction, as the local interconnects 51 and 52 of the inverter cell C1. That is, the local interconnects 51, 52, and 153 to 156 are placed at equal width, at equal spacings, and at an equal pitch (pitch L).

By the filler cell C12 of this alteration, similar effects to those obtained by the filler cell C11 can be obtained. Filler cells having a cell width other than 2 L or 4 L can also be provided in a similar manner.

(No. 2)

FIGS. 8A and 8B are plan views showing yet another example of the filler cell according to the first embodiment, where FIG. 8A shows a lower part of the cell and FIG. 8B shows an upper part of the cell. As shown in FIGS. 8A and 8B, a filler cell C13 has a basically similar configuration to the filler cell C11 shown in FIGS. 5A and 5B, but is different in the length of local interconnects in the Y direction. That is, while local interconnects 147 and 148 extend in the Y direction to positions overlapping the power supply line 111 as viewed in plan, they have no overlap with the power supply line 112. Also, while local interconnects 157 and 158 extend in the Y direction to positions overlapping the power supply line 112 as viewed in plan, they have no overlap with the power supply line 111.

By the filler cell C13 of this alteration, similar effects to those obtained by the filler cell C11 can be obtained.

While the local interconnects 147 and 148 each have an overlap with the power supply line 111 as viewed in plan and the local interconnects 157 and 158 each have an overlap with the power supply line 112 as viewed in plan, the configuration is not limited to this. The local interconnects 147 and 148 each may have no overlap with the power supply line 111 and have an overlap with the power supply line 112 as viewed in plan. Also, the local interconnects 157 and 158 each may have an overlap with the power supply line 111 and have no overlap with the power supply line 112 as viewed in plan. Otherwise, the local interconnects 147, 148, 157, and 158 each may have no overlap with the power supply line 111 nor 112 as viewed in plan. It is however preferable for at least one of the local interconnects 147, 148, 157, and 158 to have an overlap with the power supply line 111 or 112 as viewed in plan.

(No. 3)

FIGS. 9A and 9B are plan views showing yet another example of the filler cell according to the first embodiment, where FIG. 9A shows a lower part of the cell and FIG. 9B shows an upper part of the cell. As shown in FIGS. 9A and 9B, in a filler cell C14, no local interconnect is connected to any of the dummy pads 122a, 122b, 127a, and 127b. The other configuration is similar to that of the filler cell C11.

When the filler cell C14 is placed adjacent to the inverter cell C1, the nanowires 121 and 126 of the filler cell C11 are placed at the same positions in the Y direction as the nanowires 21 and 26 of the inverter cell C1, respectively. Also, the p-type dummy transistor P11 of the filler cell C14 is placed at the same level in the Z direction as the p-type transistor P1 of the inverter cell C1, and the n-type dummy transistor N11 of the filler cell C14 is placed at the same level in the Z direction as the n-type transistor N1 of the inverter cell C1. That is, by placing the p-type and n-type dummy transistors in the filler cell C14, unevenness in the density of transistor placement can be avoided or reduced. It is therefore possible to prevent or reduce variations in fabrication and improve the yield in the semiconductor integrated circuit device using a CFET.

The gate interconnect 31 of the inverter cell C1, the dummy gate interconnect 131 of the filler cell C14, and the dummy gate interconnects 35a, 35b (135a), and 135b are placed at the same pitch L in the X direction. That is, the gate interconnect 31, the dummy gate interconnect 131, and the dummy gate interconnects 35a, 35b (135a), and 135b are placed regularly. It is therefore possible to prevent or reduce variations in fabrication and improve the yield in the semiconductor integrated circuit device using a CFET.

In the X direction, transistors closest to the p-type transistor P1 and n-type transistor N1 of the inverter cell C1 are the p-type dummy transistor P11 and n-type dummy transistor N11 of the filler cell C14, respectively. Therefore, with the presence of the p-type dummy transistor P11 and the n-type dummy transistor N11, the distances of the p-type transistor P1 and the n-type transistor N1 to their adjacent transistors are fixed to a prescribed value. In other words, with the presence of the p-type dummy transistor P11 and the n-type dummy transistor N11, the distance from transistors (the p-type transistor P1 and the n-type transistor N1) closest to a cell end of a logical cell (the inverter cell C1) to their adjacent transistors can be estimated at a prescribed value. This can improve the estimation precision of transistor performance of the logical cell.

While none of the dummy pads 122a, 122b, 127a, and 127b is connected to a local interconnect in the filler cell C14, the configuration is not limited to this. One or some of the dummy pads 122a, 122b, 127a, and 127b may be connected to a local interconnect extending in the Y direction. Such a local interconnect connected to any of the dummy pads 122a, 122b, 127a, and 127b may have overlaps, or have no overlap, with the power supply lines 111 and 112 as viewed in plan.

(No. 4)

Figure 10A:
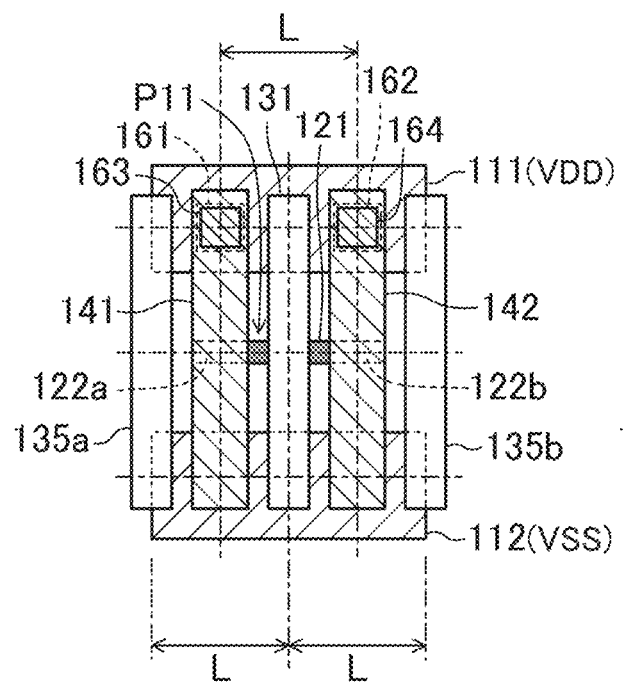
FIGS. 10A and 10B are plan views showing yet another layout structure of the filler cell according to the first embodiment.
Figure 10B:
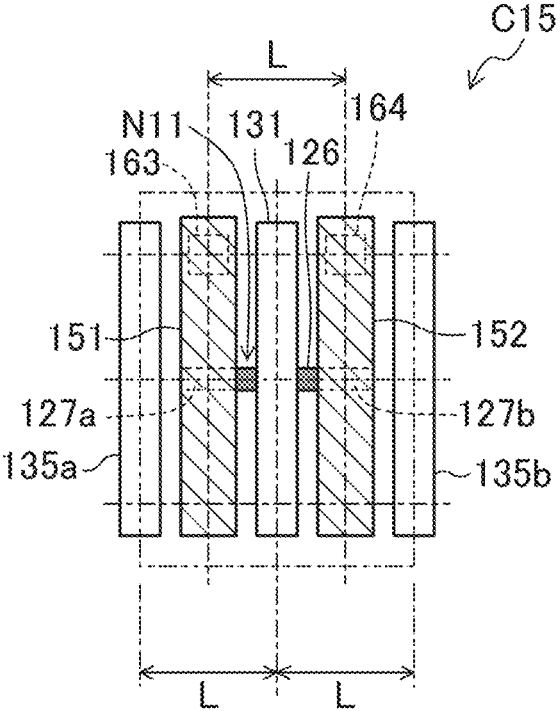

FIGS. 10A and 10B are plan views showing yet another example of the filler cell according to the first embodiment, where FIG. 10A shows a lower part of the cell and FIG. 10B shows an upper part of the cell. As shown in FIGS. 10A and 10B, a filler cell C15 has a basically similar configuration to the filler cell C11 shown in FIGS. 5A and 5B, but is different in that the local interconnects and a power supply line are connected through contacts.

In the filler cell C15, contacts 161 to 164 extending in the Z direction are formed, and are placed at positions overlapping the power supply line 111 as viewed in plan. The power supply line 111 and the local interconnect 141 are mutually connected through the contact 161, and the power supply line 111 and the local interconnect 142 are mutually connected through the contact 162. The local interconnects 141 and 151 are mutually connected through the contact 163, and the local interconnects 142 and 152 are mutually connected through the contact 164.

By the filler cell C15 of this alteration, similar effects to those obtained by the filler cell C11 can be obtained.

The power supply voltage VDD is supplied from the power supply line 111 to the dummy pads 122a, 122b, 127a, and 127b through the local interconnects 141, 142, 151, and 152 and the contacts 161 to 164, respectively. That is, the source and drain of the p-type dummy transistor P11 and the source and drain of the n-type dummy transistor N11 are all fixed to the same potential VDD. With this, floating nodes of the p-type and n-type dummy transistors can be reduced, whereby stabilization of the operation of the circuit block is achieved.

The power supply line 111 or 112 may be connected with the dummy gate interconnect 131 through a contact, to fix the potential of the dummy gate interconnect 131.

While the local interconnects 141, 142, 151, and 152 are connected with the power supply line 111 through the contacts 161 to 164, the configuration is not limited to this. The local interconnects 141, 142, 151, and 152 may be connected with the power supply line 112 through contacts.

The local interconnects 141, 142, 151, and 152 may have no overlap with the power supply line 112 as viewed in plan.

(No. 5)

FIGS. 11A and 11B are plan views showing yet another example of the filler cell according to the first embodiment, where FIG. 11A shows a lower part of the cell and FIG. 11B shows an upper part of the cell. As shown in FIGS. 11A and 11B, a filler cell C16 has a basically similar configuration to the filler cell C11 shown in FIGS. 5A and 5B, but the length of the local interconnects in the lower part of the cell is different, and the local interconnects and the power supply lines are connected through contacts.

In the lower part of the cell, local interconnects 149 and 150 are formed to extend in the Y direction. The local interconnect 149 is connected to the dummy pad 122a, and the local interconnect 150 is connected to the dummy pad 122b. The local interconnects 149 and 150 each have an overlap with the power supply line 111 but have no overlap with the power supply line 112 as viewed in plan.

In the filler cell C16, contacts 165 to 168 extending in the Z direction are formed. The contacts 165 and 166 each have an overlap with the power supply line 111 as viewed in plan, and the contacts 167 and 168 each have an overlap with the power supply line 112 as viewed in plan. The power supply line 111 and the local interconnect 149 are mutually connected through the contact 165, and the power supply line 111 and the local interconnect 150 are mutually connected through the contact 166. The power supply line 112 and the local interconnect 151 are mutually connected through the contact 167, and the power supply line 112 and the local interconnect 152 are mutually connected through the contact 168.

By the filler cell C16 of this alteration, similar effects to those obtained by the filler cell C11 can be obtained.

The power supply voltage VDD is supplied from the power supply line 111 to the dummy pads 122a and 122b through the local interconnects 149 and 150 and the contacts 165 and 166, respectively. Also, the power supply voltage VSS is supplied from the power supply line 112 to the dummy pads 127a and 127b through the local interconnects 151 and 152 and the contacts 167 and 168, respectively. That is, the source and drain of the p-type dummy transistor P11 are both fixed to the same potential VDD. Also, the source and drain of the n-type dummy transistor N11 are both fixed to the same potential VSS. With this, floating nodes of the p-type and n-type dummy transistors can be reduced, whereby stabilization of the operation of the circuit block is achieved.

Also, the power supply voltage VDD is supplied from the power supply line 111 to the local interconnects 149 and 150 placed in the lower part of the filler cell C16 through the contacts 165 and 166, and the power supply voltage VSS is supplied from the power supply line 112 to the local interconnects 151 and 152 placed in the upper part of the filler cell C16 through the contacts 167 and 168. That is, wiring capacitance occurs between the local interconnects 149 and 151 overlapping as viewed in plan and between the local interconnects 150 and 152 overlapping as viewed in plan. By such wiring capacitance, inter-power supply capacitance is produced, whereby stabilization of the power supply potentials applied to the circuit block is achieved.

While the local interconnects 149 and 150 are connected with the power supply line 111 through the contacts 165 and 166 and the local interconnects 151 and 152 are connected with the power supply line 112 through the contacts 167 and 168, the configuration is not limited to this. The local interconnects 149 and 150 may be connected with the power supply line 112, and the local interconnects 151 and 152 may be connected with the power supply line 111. In this case, the local interconnects 149 and 150 each will have no overlap with the power supply line 111 and have an overlap with the power supply line 112 as viewed in plan.

The local interconnects 151 and 152 may have no overlap with the power supply line 111 as viewed in plan.

Second Embodiment

FIGS. 12A and 12B are plan views showing a layout structure of a filler cell according to the second embodiment, where FIG. 12A shows a lower part of the cell and FIG. 12B shows an upper part of the cell. A filler cell C21 does not have a p-type nor n-type dummy transistor.

As shown in FIG. 12A, power supply lines 211 and 212 extending in the X direction are provided on both ends of the filler cell C21 in the Y direction. The power supply lines 211 and 212 are both buried power rails (BPR) formed in a buried wiring layer. The power supply line 211 supplies the same power supply voltage VDD as the power supply line 11, and the power supply line 212 supplies the same power supply voltage VSS as the power supply line 12.

In the filler cell C21, a dummy gate interconnect 231 is formed to extend in the Y direction roughly in the center in the X direction and also extend in the Z direction over the lower and upper parts of the cell. Also, dummy gate interconnects 235a and 235b are formed on both ends of the filler cell C21 in the X direction to extend in the Y direction and also extend in the Z direction over the lower and upper parts of the cell. The dummy gate interconnects 231, 235a, and 235b are placed at a same pitch L in the X direction.

In the lower part of the cell, local interconnects 241 and 242 are formed to extend in the Y direction. The local interconnects 241 and 242 both have overlaps with the power supply lines 211 and 212 as viewed in plan. The local interconnect 241 is placed between the dummy gate interconnects 231 and 235a as viewed in plan, and the local interconnect 242 is placed between the dummy gate interconnects 231 and 235b as viewed in plan.

In the upper part of the cell, local interconnects 251 and 252 are formed to extend in the Y direction. The local interconnects 251 and 252 both have overlaps with the power supply lines 211 and 212 as viewed in plan. The local interconnect 251 is placed between the dummy gate interconnects 231 and 235a as viewed in plan, and the local interconnect 252 is placed between the dummy gate interconnects 231 and 235b as viewed in plan.

None of the dummy gate interconnect 231 and the local interconnects 241, 242, 251, and 252 are connected with other interconnects.

In the filler cell C21, neither nanowires nor dummy pads are provided, and neither a p-type dummy transistor nor an n-type dummy transistor is formed. That is, the filler cell C21 is a standard cell having no logical function.

Assume here that the filler cell C21 is placed adjacent to the inverter cell C1. Note that the dummy gate interconnect placed at the boundary between the inverter cell C1 and the filler cell C21 corresponds to the dummy gate interconnect 35b of the inverter cell C1 and the dummy gate interconnect 235a of the filler cell C21.

In this case, the gate interconnect 31 of the inverter cell C1, the dummy gate interconnect 231 of the filler cell C21, and the dummy gate interconnects 35a, 35b (235a), and 135b are placed at the same pitch L in the X direction. That is, the gate interconnect 31, the dummy gate interconnect 231, and the dummy gate interconnects 35a, 35b (235a), and 235b are placed at equal width, at equal spacings, and at an equal pitch in the X direction.

The local interconnects 241 and 242 are placed at the same level in the Z direction, and also placed at the same pitch L in the X direction, as the local interconnects 41 and 42 of the inverter cell C1. That is, the local interconnects 41, 42, 241, and 242 are placed at equal width, at equal spacings, and at an equal pitch (pitch L) in the X direction.

Also, the local interconnects 251 and 252 are placed at the same level in the Z direction, and also placed at the same pitch L in the X direction, as the local interconnects 51 and 52 of the inverter cell C1. That is, the local interconnects 51, 52, 251, and 252 are placed at equal width, at equal spacings, and at an equal pitch (pitch L) in the X direction.

Having the configuration described above, the filler cell C21 having no logical function is placed adjacent to the inverter cell C1 having a logical function. The local interconnects 241 and 242 of the filler cell C21 are placed at the same level in the Z direction as the local interconnects 41 and 42 of the inverter cell C1. Also, the local interconnects 251 and 252 of the filler cell C21 are placed at the same level in the Z direction as the local interconnects 51 and 52 of the inverter cell C1. That is, the local interconnects 41, 42, 241, and 242 are placed regularly, and the local interconnects 51, 52, 251, and 252 are placed regularly. This makes it possible to prevent or reduce fabrication variations and improve the yield in the semiconductor integrated circuit device using a CFET.

Also, the local interconnects 41, 42, 241, and 242 are placed at the same pitch L in the X direction, and the local interconnects 51, 52, 251, and 252 are placed at the same pitch L in the X direction. That is, the local interconnects 41, 42, 241, and 242 are placed regularly, and the local interconnects 51, 52, 251, and 252 are placed regularly. This makes it possible to prevent or reduce fabrication variations and improve the yield in the semiconductor integrated circuit device using a CFET.

The dummy gate interconnect 231 of the filler cell C21, the gate interconnect 31 of the inverter cell C1, and the dummy gate interconnects 35a, 35b (235a), and 235b are placed at the same pitch L in the X direction. That is, the gate interconnect 31, the dummy gate interconnect 231, and the dummy gate interconnects 35a, 35b (235a), and 235b are placed regularly. This makes it possible to prevent or reduce fabrication variations and improve the yield in the semiconductor integrated circuit device using a CFET.

While the local interconnects 241, 242, 251, and 252 each have overlaps with the power supply lines 211 and 212 as viewed in plan, the configuration is not limited to this. The local interconnects 241, 242, 251, and 252 each may have no overlap with one of the power supply lines 211 and 212.

(Alterations of Filler Cell)

(No. 1)

FIGS. 13A and 13B are plan views showing another layout structure of the filler cell according to the second embodiment, where FIG. 13A shows a lower part of the cell and FIG. 13B shows an upper part of the cell. A filler cell C22 is different in cell width in the X direction from the filler cell C21. That is, while the cell width of the filler cell C21 is 2 L, the cell width of the filler cell C22 is L.

In the lower part of the cell, a local interconnect 243 extending in the Y direction is formed roughly in the center in the X direction. Also, in the upper part of the cell, a local interconnect 253 extending in the Y direction is formed roughly in the center in the X direction. The local interconnects 243 and 253 both have overlaps with the power supply lines 211 and 212 as viewed in plan.

When the filler cell C22 is placed adjacent to the inverter cell C1, the local interconnect 243 is placed at the same level in the Z direction, and also placed at the same pitch L in the X direction, as the local interconnects 41 and 42 of the inverter cell C1. Also, the local interconnect 253 is placed at the same level in the Z direction, and also placed at the same pitch L in the X direction, as the local interconnects 51 and 52 of the inverter cell C1.

With the filler cell C22 of this alteration, the local interconnect 243 is placed at the same level in the Z direction as the local interconnects 41 and 42 of the inverter cell C1, and the local interconnect 253 is placed at the same level in the Z direction as the local interconnects 51 and 52 of the inverter cell C1. That is, the local interconnects 41, 42, and 243 are placed regularly, and the local interconnects 51, 52, and 253 are placed regularly. This makes it possible to prevent or reduce fabrication variations and improve the yield in the semiconductor integrated circuit device using a CFET.

Also, the local interconnects 41, 42, and 243 are placed at the same pitch L in the X direction, and the local interconnects 51, 52, and 253 are placed at the same pitch L in the X direction. That is, the local interconnects 41, 42, and 243 are placed regularly, and the local interconnects 51, 52, and 253 are placed regularly. This makes it possible to prevent or reduce fabrication variations and improve the yield in the semiconductor integrated circuit device using a CFET.

Since the cell width of the filler cell C22 is L, this filler cell can be placed in an ultrasmall gap such as one produced when the spacing between logical cells is L.

(No. 2)

FIGS. 14A and 14B are plan views showing yet another layout structure of the filler cell according to the second embodiment, where FIG. 14A shows a lower part of the cell and FIG. 14B shows an upper part of the cell. A filler cell C23 has a basically similar configuration to the filler cell C21 shown in FIGS. 12A and 12B, but is different in that the local interconnects and a power supply line are connected through contacts.

In the filler cell C23, contacts 261 to 264 extending in the Z direction are formed, and are placed at positions overlapping the power supply line 211 as viewed in plan. The power supply line 211 and the local interconnect 241 are mutually connected through the contact 261, and the power supply line 211 and the local interconnect 242 are mutually connected through the contact 262. The local interconnects 241 and 251 are mutually connected through the contact 263, and the local interconnects 242 and 252 are mutually connected through the contact 264.

By the filler cell C24 of this alteration, similar effects to those obtained by the filler cell C21 can be obtained.

The same power supply voltage VDD is supplied from the power supply line 211 to the local interconnects 241, 242, 251, and 252 through the contacts 261 to 264, respectively. That is, the local interconnects 241, 242, 251, and 252 are all fixed to the same potential VDD. With this, floating nodes can be reduced, whereby stabilization of the operation of the circuit block is achieved.

The power supply line 211 or 212 may be connected with the dummy gate interconnect 231 through a contact to fix the potential of the dummy gate interconnect 231.

While the local interconnects 241, 242, 251, and 252 are connected with the power supply line 211 through the contacts 261 to 264, the configuration is not limited to this. The local interconnects 241, 242, 251, and 252 may be connected with the power supply line 212 through contacts.

While the filler cell C23 is a standard cell having a cell width of 2 L, the cell width of the filler cell C23 is not limited to this, but may be L. In this case, the dummy gate interconnect 231, the local interconnects 242 and 252, and the contacts 262 and 264 are unnecessary.

(No. 3)

FIGS. 15A and 15B are views showing yet another layout structure of the filler cell according to the second embodiment, where FIG. 15A shows a lower part of the cell and FIG. 15B shows an upper part of the cell. A filler cell C24 has a basically similar configuration to the filler cell C21 shown in FIGS. 12A and 12B, but the local interconnects and the power supply lines are connected through contacts and the length of the local interconnects in the lower part of the cell is different.

In the lower part of the cell, local interconnects 244 and 245 each have an overlap with the power supply line 211 but have no overlap with the power supply line 212 as viewed in plan.

In the filler cell C24, contacts 265 to 268 extending in the Z direction are formed. The contacts 265 and 266 are placed at positions overlapping the power supply line 211 as viewed in plan, and the contacts 267 and 268 are placed at positions overlapping the power supply line 212 as viewed in plan. The power supply line 211 and the local interconnect 244 are mutually connected through the contact 265, and the power supply line 211 and the local interconnect 245 are mutually connected through the contact 266. The power supply line 212 and the local interconnect 251 are mutually connected through the contact 267, and the power supply line 212 and the local interconnect 252 are mutually connected through the contact 268.

By the filler cell C24 of this alteration, similar effects to those obtained by the filler cell C21 can be obtained.

The power supply voltage VDD is supplied from the power supply line 211 to the local interconnects 244 and 245 through the contacts 265 and 266. Also, the power supply voltage VSS is supplied from the power supply line 212 to the local interconnects 251 and 252 through the contacts 267 and 268. That is, the local interconnects 244 and 245 are both fixed to the potential VDD, and the local interconnects 251 and 252 are both fixed to the potential VSS. With this, floating nodes can be reduced, whereby stabilization of the operation of the circuit block is achieved.

Also, wiring capacitance occurs between the local interconnects 244 and 251 overlapping as viewed in plan and between the local interconnects 245 and 252 overlapping as viewed in plan. By such wiring capacitance, inter-power supply capacitance is produced, whereby stabilization of the power supply potentials applied to the circuit block is achieved.

While the local interconnects 244 and 245 are connected with the power supply line 211 through the contacts 265 and 266 and the local interconnects 251 and 252 are connected with the power supply line 212 through the contacts 267 and 268, the configuration is not limited to this. The local interconnects 244 and 245 may be connected with the power supply line 212, and the local interconnects 251 and 252 may connected with the power supply line 211. In this case, the local interconnects 244 and 245 each will have no overlap with the power supply line 211 and have an overlap with the power supply line 212.

While the filler cell C24 is a standard cell having a cell width of 2 L, the cell width of the filler cell C24 is not limited to this, but may be L. In this case, the dummy gate interconnect 231, the local interconnects 245 and 252, and contacts 266 and 268 are unnecessary.

In the embodiments and the alterations described above, while each of the transistors in the upper and lower parts of each cell is assumed to have one nanowire, some or all of the transistors may have a plurality of nanowires. In this case, a plurality of nanowires may be arranged in the Y direction as viewed in plan, or arranged in the Z direction. Otherwise, a plurality of nanowires may be arranged in both the Y and Z directions. The number of nanowires included in each transistor may be different between the upper and lower parts of the cell.

While the above embodiments have been described taking nanowire FETs as an example of three-dimensional transistors, the transistor type is not limited to this. For example, a fin transistor may be used as the transistor formed in the lower part of each filler cell.

While the cross-sectional shape of the nanowires 121 and 126 is shown as a square in FIG. 6B taken in the vertical direction as viewed in plan, it is not limited to this. For example, the shape may be one other than a square (e.g., a rectangle).

In the inverter cells C1 and C2 and the filler cells C11 to C16, while the p-type transistor is formed in the lower part of each cell and the n-type transistor is formed in the upper part of the cell, the configuration is not limited to this. The p-type transistor may be formed in the upper part of the cell and the n-type transistor may be formed in the lower part of the cell.

While the power supply lines 11, 12, 111, 112, 211, and 212 are buried power rails, the configuration is not limited to this. For example, the power supply lines 11, 12, 111, 112, 211, and 212 may be routed in an M1 wiring layer.

Since the present disclosure is applicable to a semiconductor integrated circuit device provided with a standard cell using a CFET, it is useful for improvement of the performance of a semiconductor chip, for example.

What is claimed is:

1. A semiconductor integrated circuit device provided with a first standard cell having a logical function and a second standard cell having no logical function placed adjacent to the first standard cell, wherein:
the first standard cell includes a first layout structure comprising:
a first power supply line section extending in a first direction, the first power supply line section being a part of a first power supply line supplying a first power supply voltage;
a second power supply line section extending in the first direction, the second power supply line section being a part of a second power supply line supplying a second power supply voltage different from the first power supply voltage;
a first transistor that is a three-dimensional transistor of a first conductivity type;
a second transistor that is a three-dimensional transistor of a second conductivity type, formed at a position higher than the first transistor in a depth direction, a channel portion thereof being placed at a position overlapping a channel portion of the first transistor in a plan view;
first and second local interconnects extending in a second direction perpendicular to the first direction, respectively connected to a source and drain of the first transistor; and
third and fourth local interconnects extending in the second direction, respectively connected to a source and drain of the second transistor, the second standard cell includes a second layout structure comprising:
a third power supply line section extending in the first direction, the third power supply line section being a part of the first power supply line supplying the first power supply voltage;
a fourth power supply line section extending in the first direction, the fourth power supply line section being a part of the second power supply line supplying the second power supply voltage;
a first dummy transistor that is a three-dimensional transistor of the first conductivity type, a channel portion thereof being placed at a same position as the channel portion of the first transistor in the second direction, the first dummy transistor being placed at a same level as the first transistor in the depth direction;
a second dummy transistor that is a three-dimensional transistor of the second conductivity type, a channel portion thereof being placed at a same position as the channel portion of the second transistor in the second direction, the second dummy transistor being placed at a same level as the second transistor in the depth direction;

fifth and sixth local interconnects extending in the second direction, respectively connected to a source and drain of the first dummy transistor; and seventh and eighth local interconnects extending in the second direction, respectively connected to a source and drain of the second dummy transistor, the fifth, sixth, seventh and eighth local interconnects each have an overlap with the third and fourth power supply line sections in the plan view, and at least one of the third or fourth power supply line sections is not connected to the fifth, sixth, seventh and eighth local interconnects.

2. The semiconductor integrated circuit device of claim 1, wherein:

the first layout structure further comprises a gate interconnect extending in the second direction and also in the depth direction, which is to be gates of the first and second transistors, the second layout structure further comprises a first dummy gate interconnect extending in the second direction and also in the depth direction, which is to be gates of the first and second dummy transistors, a second dummy gate interconnect is provided to extend in the second direction and also in the depth direction at a boundary between the first standard cell and the second standard cell, and the gate interconnect, the first dummy gate interconnect, and the second dummy gate interconnect are placed at a same pitch in the first direction.

3. The semiconductor integrated circuit device of claim 1, wherein
at least one of the fifth, sixth, seventh, and eighth local interconnects has an overlap with the third power supply line section in the plan view.

4. The semiconductor integrated circuit device of claim 3, wherein
the fifth, sixth, seventh, and eighth local interconnects each have overlaps with the third and fourth power supply line sections in plan view.

5. The semiconductor integrated circuit device of claim 3, wherein
the fifth, sixth, seventh, and eighth local interconnects are connected with the third power supply line section.

6. The semiconductor integrated circuit device of claim 3, wherein
the fifth and sixth local interconnects are connected with the third power supply line section, and
the seventh and eighth local interconnects are connected with the fourth power supply line section.

7. The semiconductor integrated circuit device of claim 1, wherein
the first, second, fifth, and sixth local interconnects are placed at a same level in the depth direction and placed at a same pitch in the first direction, and
the third, fourth, seventh, and eighth local interconnects are placed at a same level in the depth direction and placed at a same pitch in the first direction.

8. The semiconductor integrated circuit device of claim 2, wherein:
the first, second, fifth, and sixth local interconnects are placed at a same pitch in the first direction as the same pitch of the gate interconnect, the dummy gate interconnect, and the second dummy gate interconnect, and
the third, fourth, seventh, and eighth local interconnects are placed at a same pitch in the first direction as the same pitch of the gate interconnect, the dummy gate interconnect, and the second dummy gate interconnect.

9. A semiconductor integrated circuit device provided with a first standard cell having a logical function and a second standard cell having no logical function placed adjacent to the first standard cell, wherein:

the first standard cell includes a first layout structure comprising:

a first power supply line section extending in a first direction, the first power supply line section being a part of a first power supply line supplying a first power supply voltage;

a second power supply line section extending in the first direction, the second power supply line section being a part of a second power supply line supplying a second power supply voltage different from the first power supply voltage;

a first transistor that is a three-dimensional transistor of a first conductivity type;

a second transistor that is a three-dimensional transistor of a second conductivity type, formed at a position higher than the first transistor in a depth direction, a channel portion thereof being placed at a position overlapping a channel portion of the first transistor in a plan view; and a gate interconnect extending in a second direction perpendicular to the first direction and also extending in the depth direction, and serving as gates of the first transistor and the second transistor, the second standard cell includes a second layout structure comprising:

a third power supply line section extending in the first direction, the third power supply line section being a part of the first power supply line supplying the first power supply voltage;

a fourth power supply line section extending in the first direction, the fourth power supply line section being a part of the second power supply line supplying the second power supply voltage;

a first dummy transistor that is a three-dimensional transistor of the first conductivity type, a channel portion thereof being placed at a same position as the channel portion of the first transistor in the second direction, the first dummy transistor being placed at a same level as the first transistor in the depth direction;

a second dummy transistor that is a three-dimensional transistor of the second conductivity type, a channel portion thereof being placed at a same position as the channel portion of the second transistor in the second direction, the second dummy transistor being placed at a same level as the second transistor in the depth direction; and a dummy gate interconnect extending in the second direction and also extending in the depth direction, the gate interconnect and the dummy gate interconnect have a same length in the second direction, the gate interconnect overlaps the first power supply line section and the second power supply line section in the plan view, and the dummy gate interconnect overlaps the third power supply line section and the fourth power supply line section in the plan view;

first, second, third, fourth, fifth, sixth, seventh and eight local interconnects extending in the second direction, respectively connected to a source and drain of the first transistor, the second transistor, the first dummy transistor and the second dummy transistor;
the fifth, sixth, seventh and eighth local interconnects each have an overlap with the third and fourth power supply line sections in the plan view, and
at least one of the third or fourth power supply line sections is not connected to the fifth, sixth, seventh and eighth local interconnects.

\* \* \* \* \*

UNITED STATES PATENT AND TRADEMARK OFFICE
CERTIFICATE OF CORRECTION

| | | |
|---|---|---|
| PATENT NO. | : 12,237,266 B2 | Page 1 of 1 |
| APPLICATION NO. | : 17/357211 | |
| DATED | : February 25, 2025 | |
| INVENTOR(S) | : Koshiro Date | |

It is certified that error appears in the above-identified patent and that said Letters Patent is hereby corrected as shown below:

On the Title Page

In item "(72) Inventor:", the inventor should be listed as:
(72) Inventor: Koshiro Date, Yokohama-shi, Kanagawa (JP)

Signed and Sealed this
Eighth Day of April, 2025

Coke Morgan Stewart
*Acting Director of the United States Patent and Trademark Office*